United States Patent
Yuzurihara et al.

(10) Patent No.: US 10,355,607 B2
(45) Date of Patent: Jul. 16, 2019

(54) REGENERATION CIRCULATOR, HIGH-FREQUENCY POWER SUPPLY DEVICE, AND HIGH-FREQUENCY POWER REGENERATION METHOD

(71) Applicant: KYOSAN ELECTRIC MFG. CO., LTD., Yokohama-shi, Kanagawa (JP)

(72) Inventors: Itsuo Yuzurihara, Yokohama (JP); Satoshi Aikawa, Yokohama (JP); Ryosuke Ohma, Yokohama (JP)

(73) Assignee: KYOSAN ELECTRIC MFG. CO., LTD., Yokohama-shi (JP)

( * ) Notice: Subject to any disclaimer, the term of this patent is extended or adjusted under 35 U.S.C. 154(b) by 0 days.

(21) Appl. No.: 15/503,778

(22) PCT Filed: Nov. 19, 2014

(86) PCT No.: PCT/JP2014/080580
§ 371 (c)(1),
(2) Date: Feb. 14, 2017

(87) PCT Pub. No.: WO2016/031091
PCT Pub. Date: Mar. 3, 2016

(65) Prior Publication Data
US 2017/0279364 A1 Sep. 28, 2017

(30) Foreign Application Priority Data
Aug. 25, 2014 (JP) .................................. 2014-170664

(51) Int. Cl.
*H02M 7/48* (2007.01)
*H02M 3/335* (2006.01)
(Continued)

(52) U.S. Cl.
CPC .......... *H02M 3/33569* (2013.01); *H01P 1/38* (2013.01); *H01P 5/18* (2013.01); *H02J 50/20* (2016.02);
(Continued)

(58) Field of Classification Search
CPC ......... H03F 2200/387; H03F 2200/451; H03F 2200/541; H03H 7/38; H03H 7/40; H04M 2007/4803
(Continued)

(56) References Cited

U.S. PATENT DOCUMENTS 7,180,758 B2    2/2007   Lincoln et al.
2004/0242166 A1  12/2004  Ikuma
(Continued)

FOREIGN PATENT DOCUMENTS

CN    101295887 A    10/2008
CN    102668325 A    9/2012
(Continued)

OTHER PUBLICATIONS

Written Opinion of International Search Authority dated Jan. 13, 2015, issued in counterpart International Application No. PCT/JP2014/080580 (pp. 1-6).
(Continued)

*Primary Examiner* — Jue Zhang
*Assistant Examiner* — David A. Singh
(74) *Attorney, Agent, or Firm* — Westerman, Hattori, Daniels & Adrian, LLP

(57) ABSTRACT

An excessive voltage rise of load voltage, caused by an impedance mismatching on a transmission path, is prevented, and high-frequency power is regenerated. A parallel impedance is connected to the transmission path during the voltage rise, thereby regenerating voltage caused by a standing wave and preventing excessive load voltage, together with enhancing energy usage efficiency. Establishing the parallel impedance for the load impedance, on the transmission path between the high-frequency amplifier circuit of the high-frequency power supply device and the high-frequency load, reduces impedance at the connecting position to prevent generation of excessive voltage on the transmission path, and high-frequency power is regenerated from the transmission path by the parallel impedance.

18 Claims, 19 Drawing Sheets

(51) Int. Cl.
*H01P 1/38* (2006.01)
*H01P 5/18* (2006.01)
*H03F 1/56* (2006.01)
*H03F 3/193* (2006.01)
*H03F 3/217* (2006.01)
*H03F 3/60* (2006.01)
*H02J 50/20* (2016.01)
*H01J 37/32* (2006.01)

(52) U.S. Cl.
CPC .............. *H02M 7/48* (2013.01); *H03F 1/56* (2013.01); *H03F 3/193* (2013.01); *H03F 3/2171* (2013.01); *H03F 3/601* (2013.01); *H01J 37/32183* (2013.01); *H03F 2200/387* (2013.01); *H03F 2200/451* (2013.01); *H03F 2200/541* (2013.01)

(58) Field of Classification Search
USPC .................................. 333/17.3, 32, 33, 124
See application file for complete search history.

(56) References Cited

U.S. PATENT DOCUMENTS

| | | | |
|---|---|---|---|
| 2008/0203070 A1 | 8/2008 | Ilic et al. | |
| 2008/0268796 A1* | 10/2008 | Fukuda | H04B 1/1607 455/127.1 |
| 2009/0244934 A1 | 10/2009 | Wang et al. | |
| 2012/0218799 A1* | 8/2012 | Furukawa | H02J 17/00 363/126 |
| 2015/0115797 A1 | 4/2015 | Yuzurihara et al. | |

FOREIGN PATENT DOCUMENTS

| | | |
|---|---|---|
| EP | 1 272 014 A1 | 1/2003 |
| EP | 1 986 335 A2 | 10/2008 |
| JP | 5-151535 A | 6/1993 |
| JP | 10-233606 A | 9/1998 |
| JP | 10-511836 A | 11/1998 |
| JP | 2001-186062 A | 7/2001 |
| JP | 2013-162626 A | 8/2013 |
| JP | 2014-2909 A | 1/2014 |
| JP | 2014-3774 A | 1/2014 |
| TW | 200845834 | 11/2008 |
| TW | 201427496 A | 7/2013 |
| TW | 201429324 A | 7/2014 |
| WO | 2011/052653 A1 | 5/2011 |
| WO | 2013/190987 A1 | 12/2013 |

OTHER PUBLICATIONS

Extended (supplementary) European Search Report dated Feb. 21, 2018, issued in counterpart European Application No. 14900492.1. (9 pages).
Suetsugu et al., "Clamping of Switch Peak Voltage with Diode and Transformer at Output of Class E Amplifier for Renewable Energy Applications", International Journal of Renewable Energy Research, vol. 3, No. 2, pp. 359-363, 2013.
International Search Report dated Jan. 13, 2015, issued in counterpart International Application No. PCT/JP2014/080580 (1 page).
Taiwanese Search Report 103143486 (4 pages).
Office Action dated Apr. 19, 2018, issued in counterpart Korean application No. 10-2017-7004777, with English translation. (9 pages).
Office Action dated Sep. 19, 2018, issued in counterpart Chinese Application No. 201480081515.7, with English translation. (17 pages).

* cited by examiner

SHORT-CIRCUIT

BEFORE
REGENERATION

REGENERATIVE
OPERATION

REGENERATION CIRCULATOR OF
HIGH-FREQUENCY POWER SUPPLY DEVICE

TRANSMISSION-LINE ELECTRICAL LENGTH ℓ
vs ELECTRODE VOLTAGE Vpp
WITH OR WITHOUT REGENERATION CIRCUIT

BASIC CONFIGURATION OF
REGENERATION CIRCULATOR

EXAMPLE WHERE CAPACITOR IS INSTALLED IN THE
SECONDARY SIDE OF TRANSFORMER

EXAMPLE WHERE DC REACTOR IS INSTALLED IN
THE SUBSEQUENT STAGE OF RECTIFIER

EXAMPLE WHERE DC REACTOR IS INSTALLED
IN THE SUBSEQUENT STAGE OF RECTIFIER

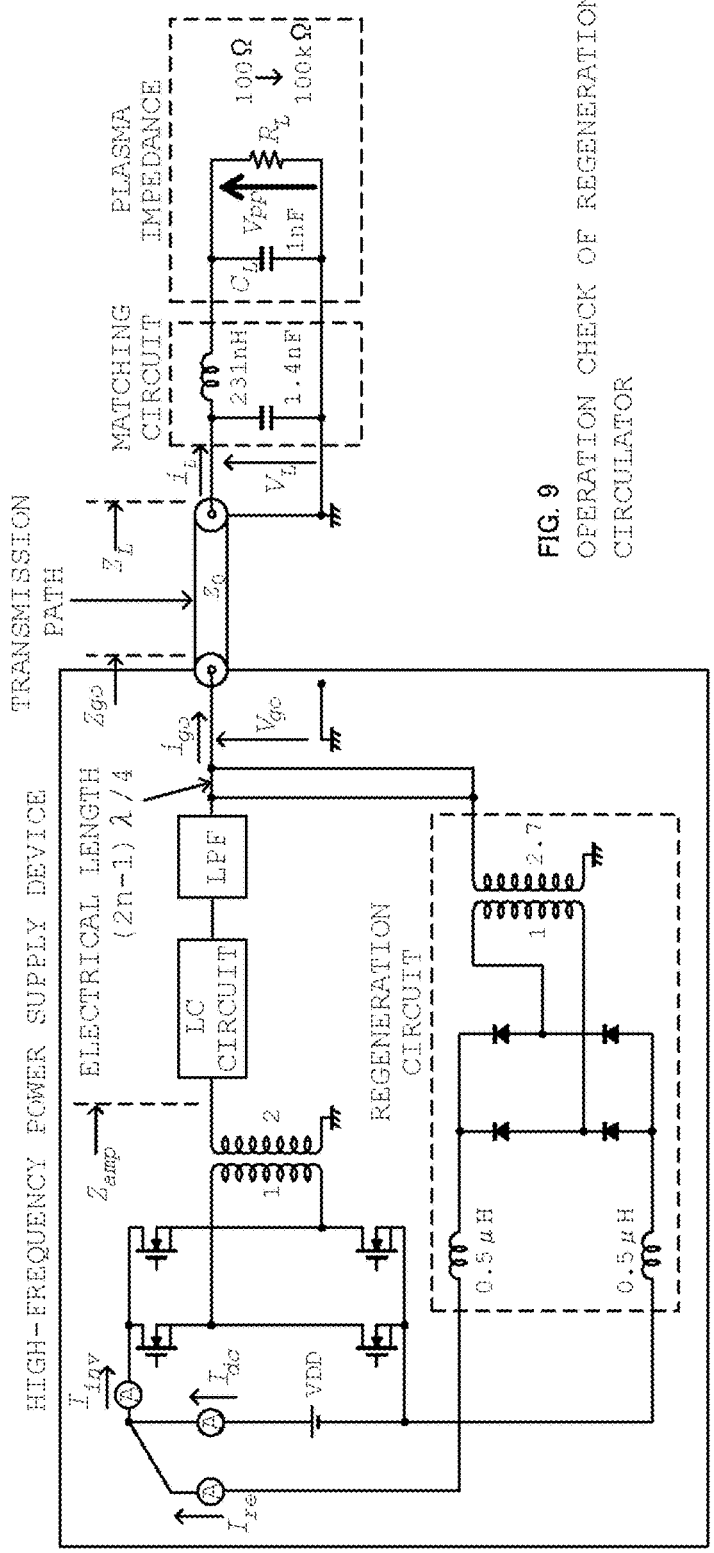
FIG. 9 OPERATION CHECK OF REGENERATION CIRCULATOR

WAVEFORMS OF VOLTAGE AND CURRENT

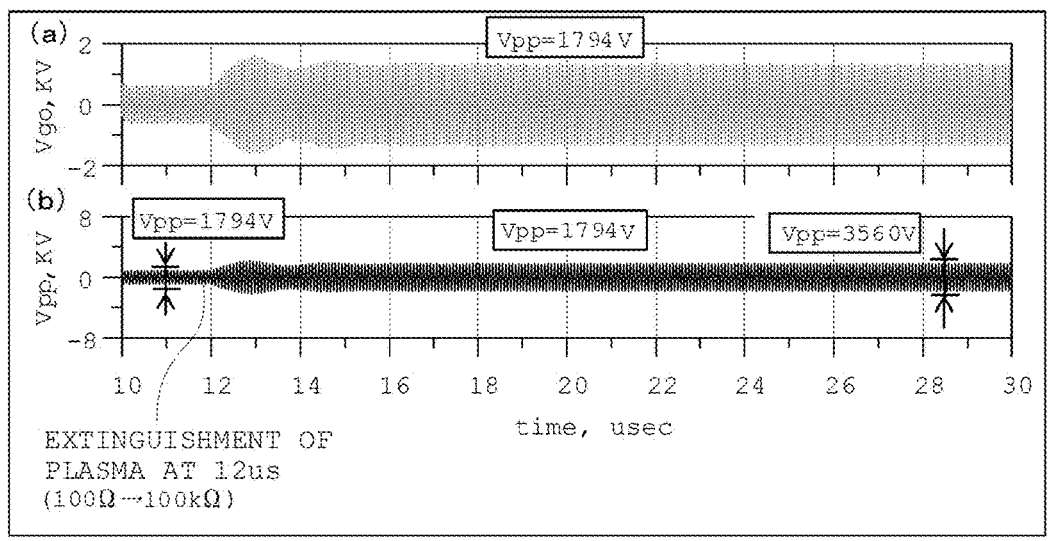
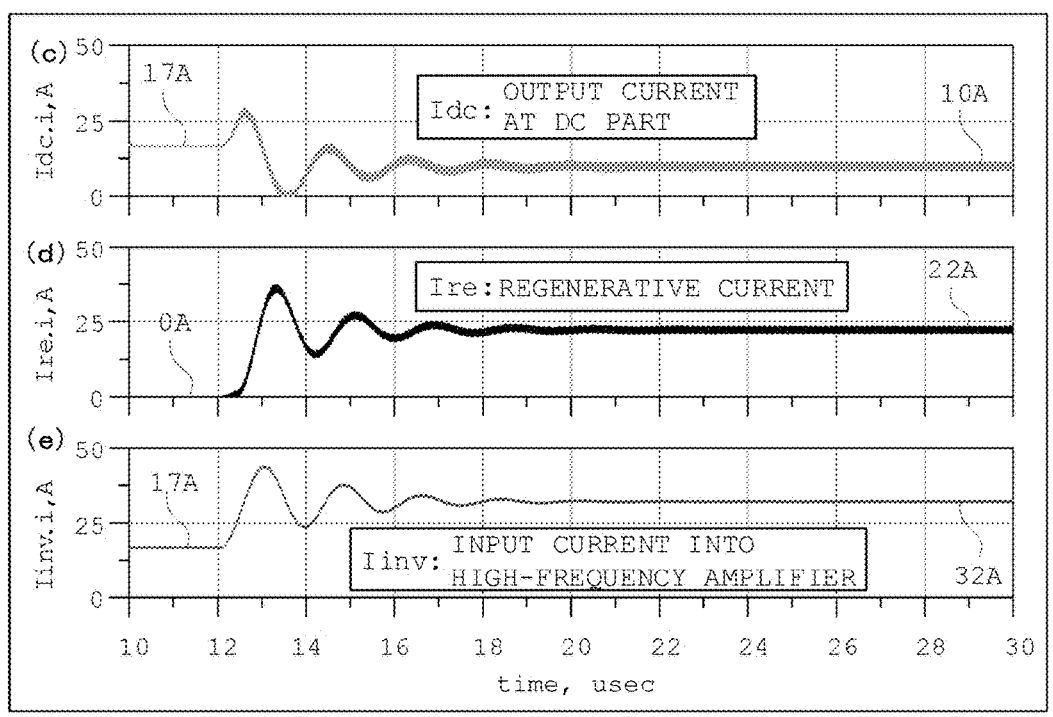
FIG. 11
WAVEFORMS OF VOLTAGE AND CURRENT

TRANSMISSION-LINE ELECTRICAL
LENGTH (0 TO $\lambda/2$) UPON
PLASMA EXTINGUISHMENT
(VSWR≒∞)WHEN THERE IS NO
REGENERATION CIRCUIT vs $Z_{amp}$ TRANSMISSION-LINE ELECTRICAL
LENGTH (0 TO $\lambda/2$) UPON
PLASMA EXTINGUISHMENT
(VSWR≒∞)WHEN THERE IS A
REGENERATION CIRCUIT vs $Z_{amp}$

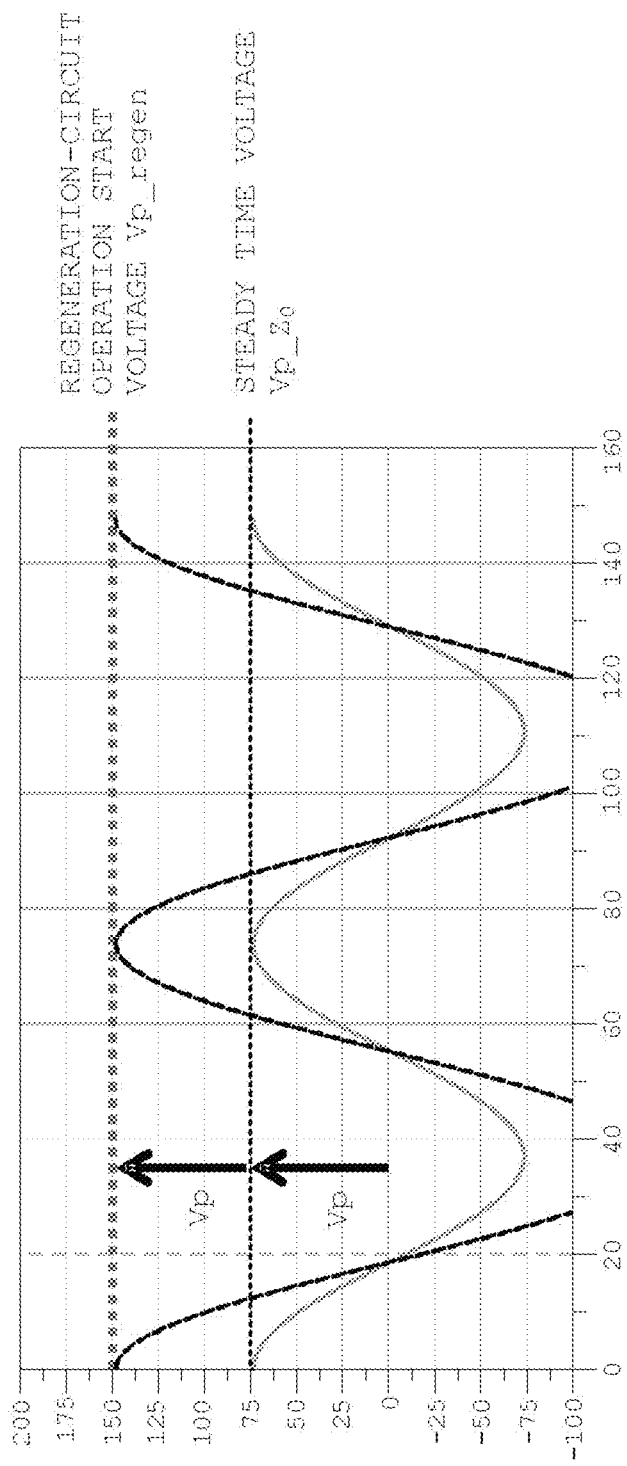
FIG. 14  VOLTAGE AT POINT P (k=2)

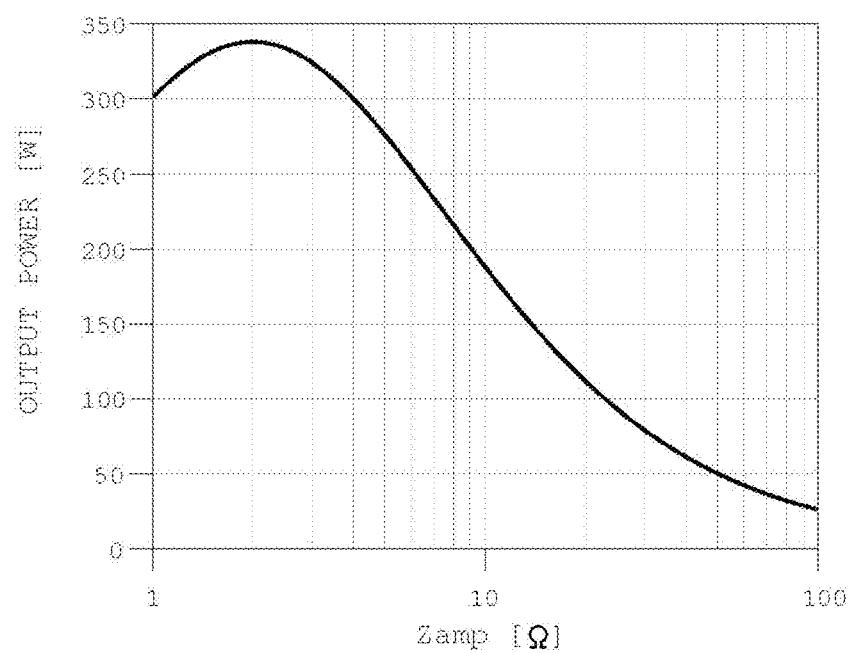
FIG. 16 GRAPH OF Zamp vs OUTPUT POWER

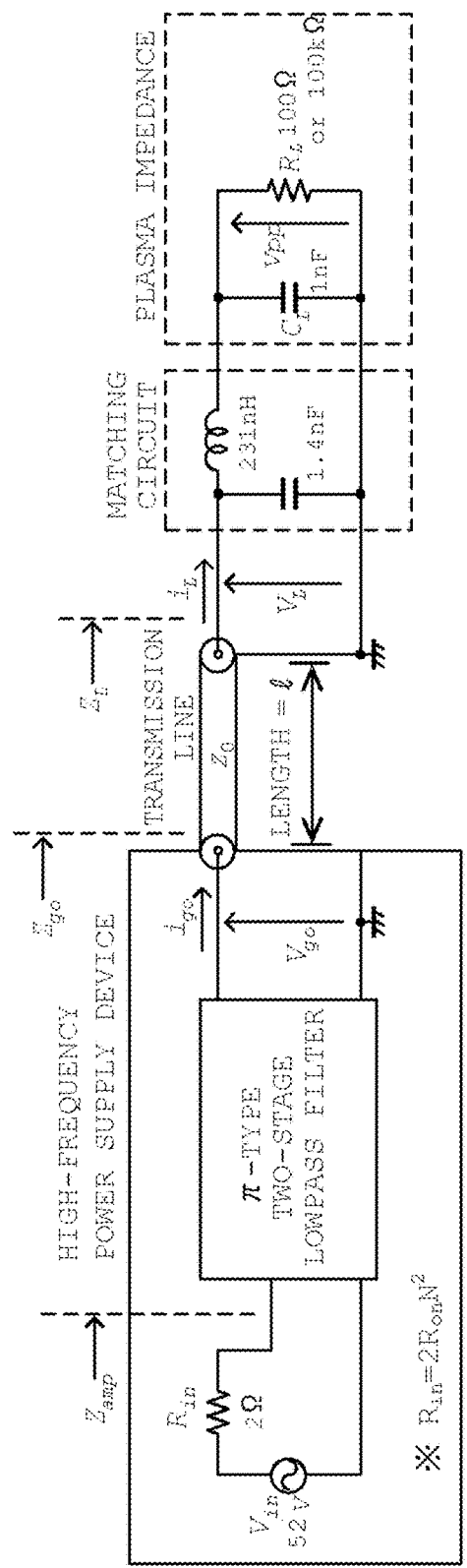
FIG. 17 CONNECTION DIAGRAM CONSIDERING PLASMA LOAD

FIG. 18A TRANSMISSION-PATH ELECTRICAL LENGTH vs ELECTRODE VOLTAGE
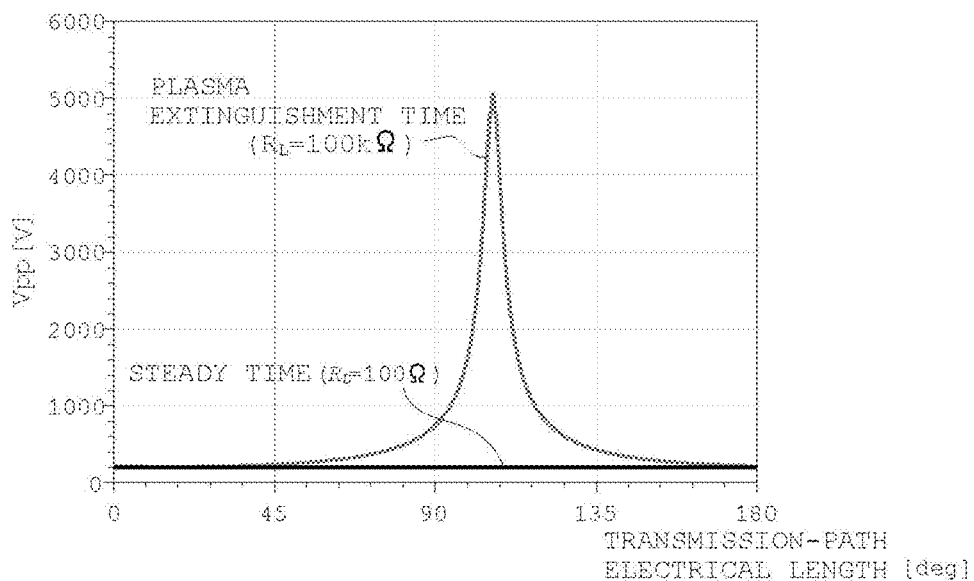
FIG. 18B TRANSMISSION-PATH ELECTRICAL LENGTH vs |Zamp|
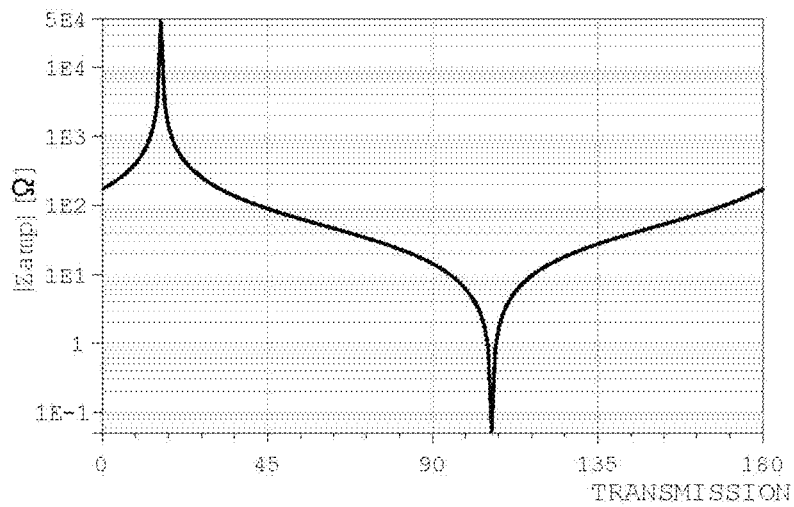
FIG. 18C IMPEDANCE OF $Z_L$, $Z_{amp}$
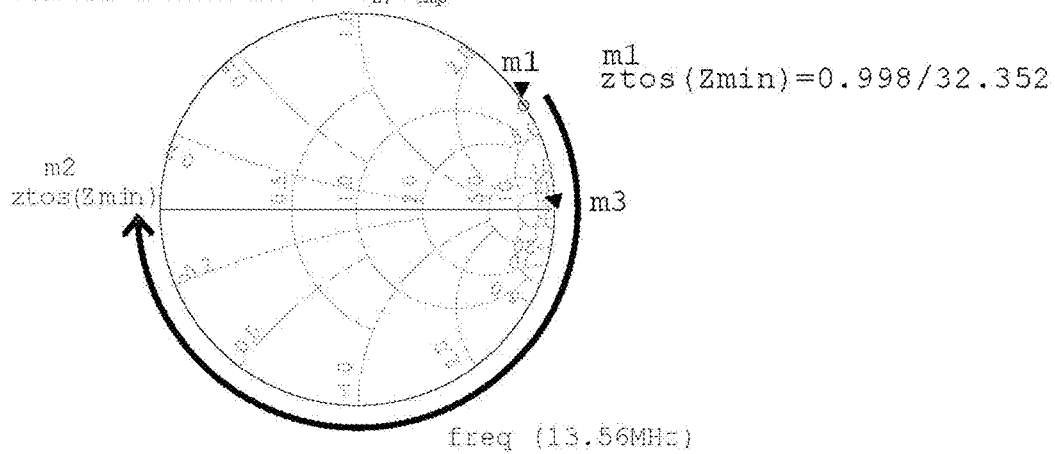

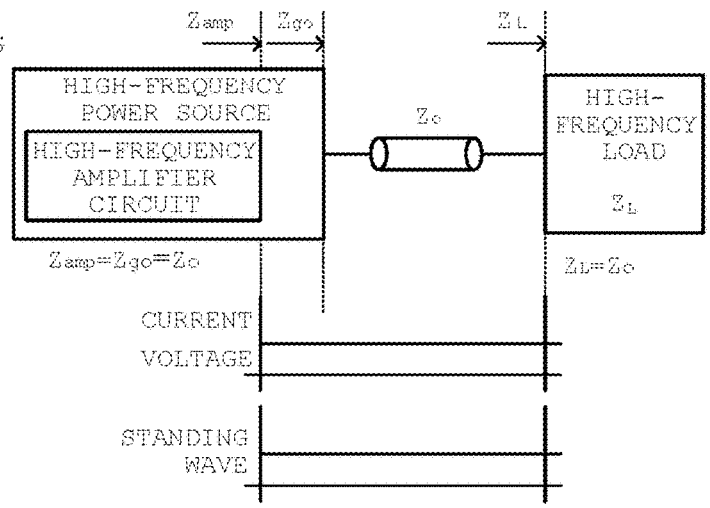
FIG. 19A MATCHING
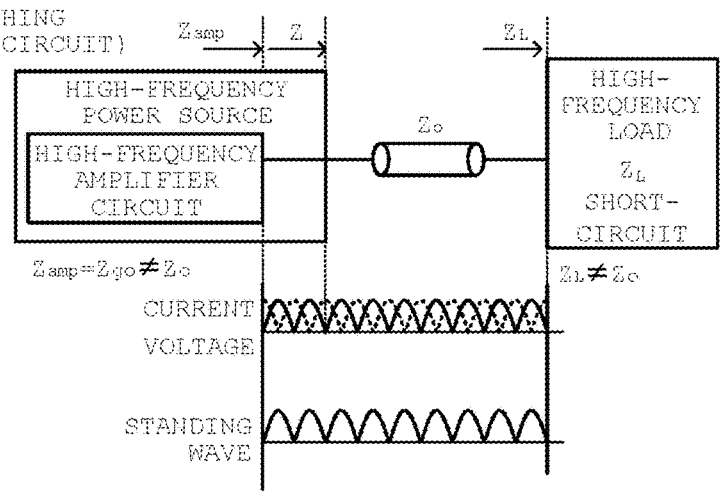
FIG. 19B MISMATCHING (SHORT-CIRCUIT)
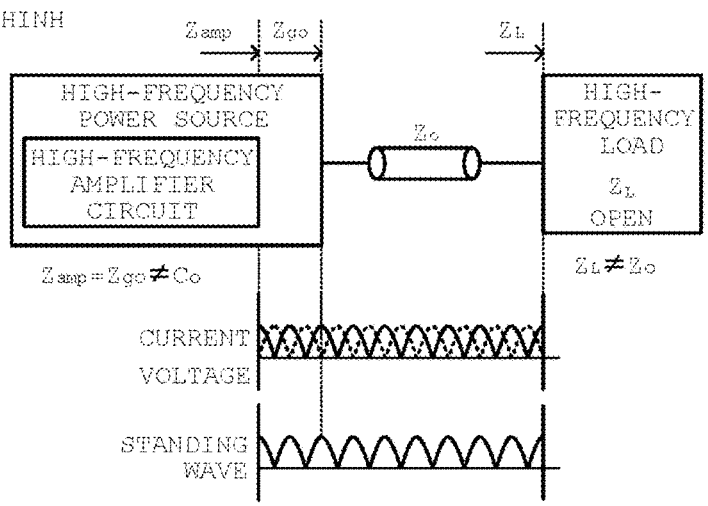
FIG. 19C MISMATCHINH (OPEN)

REGENERATION CIRCULATOR, HIGH-FREQUENCY POWER SUPPLY DEVICE, AND HIGH-FREQUENCY POWER REGENERATION METHOD

TECHNICAL FIELD

The present invention relates to a supply of power, for feeding high-frequency power into a load device where plasma is a load, such as liquid crystal panel manufacturing equipment, semiconductor manufacturing equipment, and laser oscillator. More particularly, it relates to a regeneration circulator configured to regenerate power from a transmission path for transmitting high-frequency power, a high-frequency power supply device provided with the regeneration circulator, and a method of regenerating high-frequency power.

BACKGROUND ART

Ask a high-frequency power supply (RF generator) that feeds high-frequency power into a high-frequency load such as a plasma load (plasma source), a class-D high-frequency power supply device is known, for instance. Since the class-D high-frequency power supply device operates in a switch mode according to switching of high-frequency power amplifying elements, internal resistance $R_{in}$ in the class-D high-frequency power supply device is determined by an ON-resistance value $R_{on}$ in a saturated region of the high-frequency power amplifying elements. In general, the ON-resistance value $R_{on}$ has resistance which is lower than characteristic impedance $Z_0$ for transmitting output power.

The class-D high-frequency power supply device feeds the output power into the load device via a transmission path having the characteristic impedance $Z_0$. Therefore, the impedance $Z_{g0}$ viewed from the output end of the generator is designed in such a manner that it becomes equal to the characteristic impedance $Z_0$ ($Z_{g0}=Z_0$) in a steady state, thereby maximizing the supplying of power.

The high-frequency power supply device outputs high-frequency waves generated in a high-frequency amplifier circuit internally provided, into the transmission path via an output circuit such as a power combining circuit and a matching circuit, and feeds the high-frequency waves into the load. In general, the impedance $Z_{amp}$ viewed from the high-frequency amplifier circuit is represented by the impedance that is obtained by impedance transformation of the impedance $Z_{g0}$ at the output end of the high-frequency power supply device in a steady state, through the output circuit within the high-frequency power supply device.

FIG. 15 schematically illustrates a circuit of the class-D high-frequency power supply device. In FIG. 15A, the class-D high-frequency power supply device 101 allows the high-frequency amplifier circuit 112 to make direct current from the DC power source 111 higher in frequency, passes thus obtained high-frequency wave through the output circuit 113, and thereafter, feeds the high-frequency wave from the output end of the generator into the load 102, via the transmission path 104.

The high-frequency amplifier circuit 112 may include, for example, a bridge circuit 112a of the high-frequency power amplifying elements and a transformer 112b. The output circuit 113 may include, for example, a matching circuit 113a for matching impedance to the impedance $Z_0$ of the transmission path 104, and a filter circuit 113b for removing a noise component. The impedance $Z_{amp}$ viewed from the high-frequency amplifier circuit 112 is obtained by impedance transformation of the impedance $Z_{g0}$ at the output end of the class-D high-frequency power supply device 101 by using the impedance of the output circuit 113.

FIG. 15B briefly illustrates the impedance $Z_{amp}$, showing a configuration that a circuit of AC voltage source $V_{in}$ and internal resistance $R_{in}$ substitutes for the DC power source 111 and the high-frequency amplifier circuit 112 including the bridge circuit 112a and the transformer 112b. The output power of this circuit is maximized when the relationship of $Z_{amp}=R_{in}=2R_{on}N^2$ is established. However, in fact, there are restrictions by design of the high-frequency power amplifying elements and the DC power source part, and further, the impedance $Z_{amp}$ is required to be defined as a lagging load. Therefore, it is not necessarily defined as $Z_{amp}=R_{in}$ for maximizing power.

In the high-frequency power supply device, in order to prevent damage on the high-frequency source and unstable operations, caused by reflected waves due to an impedance mismatch on the transmission path, a configuration is suggested where the class-D high-frequency power supply device incorporates a 3-dB coupler to reduce the reflected waves by using an internal dummy load.

There is also known another configuration that prevents reflected waves from returning to the high-frequency source by placing a circulator on the transmission path, and converts the reflected waves into heat by a dummy load (see the part of "Background Art" of the Patent Document 1). In here, the circulator is a passive element having a function to output high-frequency signals inputted in a certain port among plural ports, to the next port only, preventing reflected waves from returning to the high-frequency source, whereby it is possible to avoid damage and unstable operations of the high-frequency source.

In the configuration where the 3-dB coupler is employed, however, a main body of the 3-dB coupler and the internal dummy load have to be implemented within the high-frequency power supply device, thus causing a problem that the configuration of the high-frequency power supply device may become large in size. Further in the configuration employing the 3-dB coupler, there is a problem that the required number of high-frequency amplifier circuits is a multiple of 2 of the number of the 3-dB couplers, and there is another problem that when a reflected wave is generated, reflected current passing through the high-frequency amplifier circuit may cause unbalance of over 200% at a maximum.

Therefore, in the configuration where the dummy load is employed, reflected waves are thermally converted by the dummy load that is connected to a port, causing a problem that energy usage efficiency is low. As a configuration for solving the problems above, there is suggested a power regeneration technique that extracts reflected harmonics from the transmission path, and converting the reflected harmonics being extracted into direct current, thereby regenerating high-frequency power (Patent Document 1).

PRIOR ART DOCUMENT

Patent Document

Patent Document 1
International Publication No. WO 2011/052653

DISCLOSURE OF THE INVENTION

Problems to be Solved by the Invention

In the circuit configuration of FIG. 15B, if the matching circuit, the filter circuit, and the transmission path are lossless, the power fed into the load is expressed by $V_{in}$, $R_{in}$, and $Z_{amp}$ which are used as parameters. Among those three parameters defining the supply of power, $Z_{amp}$ is a value obtained by impedance transformation of the impedance $Z_{g0}$ at the output end of the high-frequency power supply device. This value corresponds to the impedance viewed from the internal high-frequency amplifier circuit, and variations of the load impedance are reflected thereon.

The load state varies according to an impedance mismatch. By way of example, a plasma load is known as a dynamic load that fluctuates according to various conditions such as pressure, gas flow volume, and arching within a plasma chamber. The impedance $Z_{amp}$ varies in association with the fluctuation of the load impedance. On the other hand, among the three parameters described above, when high-frequency power is being applied, $R_{in}$ indicates a fixed constant determined by characteristics of the power amplifier elements and $V_{in}$ indicates voltage $V_{DD}$ of the DC power source.

FIG. 16 illustrates one example of output power variation in association with fluctuation of the impedance $Z_{amp}$. This example here indicates power that is supplied to the load, where $V_{in}=52$ V and $R_{in}=2\Omega$, the impedance $Z_{amp}$ in a steady state is $50\Omega$, and the impedance $Z_{amp}$ varies from $1\Omega$ to $100\Omega$, in the circuit configuration of FIG. 15B. According to FIG. 16, for example, an impedance mismatch occurs due to load variation starting from the state of rated operation ($Z_{amp}=50\Omega$, output power=50 W), and the impedance $Z_{amp}$ varies from $50\Omega$ to $2\Omega$. In this case, the supply of power into the load varies from 50 W to 340 W, resulting in approximately seven-times change.

Since constant-voltage control on $V_{in}$ can be performed, against the fluctuation in supplying power caused by abrupt change of the impedance $Z_{amp}$, it is possible to maintain the output power to be a set value, as long as the varying velocity of the impedance $Z_{amp}$ falls within a range of response speed for performing the constant-voltage control on $V_{in}$. However, if the impedance $Z_{amp}$ changes abruptly while high-frequency power is applied, exceeding the response speed of the constant-power control on $V_{in}$, it becomes difficult to prevent the fluctuation in supplying power into the plasma load, just by the constant-voltage control of $V_{in}$.

Such abrupt change in supplying power into the plasma load may cause abrupt increase of load voltage, including electrode voltage $V_{pp}$. Excessively large electrode voltage $V_{pp}$, even for a moment, may become a factor of arching generation due to dielectric breakdown, resulting in a failure of a semiconductor or liquid crystal panel in process.

An object of the present invention is to solve the conventional problems as described above, and it is directed to preventing an excessive rise of load voltage caused by the impedance mismatch on the transmission path, and to regeneration of high-frequency power.

Means for Solving the Problems

The present invention puts focus on that a voltage rise due to an impedance mismatch on a transmission path is likely to become excessive, by a standing wave caused by a reflected wave which is generated by the impedance mismatch, and the present invention is directed to a configuration that a parallel impedance is connected to the transmission path during the voltage rise time, thereby regenerating voltage that is based on the standing wave, further reducing the excessive voltage on the load, as well as enhancing energy usage efficiency.

(Electrical Length and Voltage Variation Due to Standing Wave)

There will now be described an electrical length of the transmission path and voltage variation due to the standing wave. It is known that voltage on the load side varies according to the electrical length of the transmission path connecting between the high-frequency power supply device and the load.

FIG. 17 illustrates a circuit example where a plasma impedance and a matching circuit substitute for the load as shown in FIG. 15. In the circuit example of FIG. 17, the matching circuit performs matching in such a manner that the load impedance $Z_L$ becomes $50\Omega$ when an active component $R_L$ in the plasma impedance is $100\Omega$. It should be noted that the description here shows an example that an operation runs at an operating frequency of 13.56 MHz.

As an operation example of the high-frequency power supply device, in terms of the active component $R_L$ of the plasma load impedance $Z_L$, a resistance component at a steady time is assumed as $100\Omega$. If the resistance component at the open time when plasma is extinguished, is assumed as 100 k$\Omega$, FIG. 18A and FIG. 18B illustrate respectively, electrode voltage $V_{pp}$ being the load voltage, and an absolute value $|Z_{amp}|$ of the impedance $Z_{amp}$, when the electrical length l of the transmission path varies from 0 degree angle to 180 degree angle. In FIG. 18C, the load impedance $Z_L$ and the impedance $Z_{amp}$ of the high-frequency amplifier circuit are shown in the Smith chart.

As shown in FIG. 18A and FIG. 18B, the electrode voltage $V_{pp}$ which is proportional to the load voltage $V_L$ becomes the local maximal value when an absolute value $|Z_{amp}|$ of the impedance $Z_{amp}$ is the local minimal value. Therefore, it is possible to know an increase of the load voltage $V_L$ increases according to the relationship between the absolute value $|Z_{amp}|$ of $Z_{amp}$ and the electrical length l.

In general, the load impedance $Z_L$ is determined by the impedance $Z_{g0}$ and current $I_{g0}$ at the output end of the high-frequency power supply device, the characteristic impedance $Z_0$ of the transmission path, and a length of the transmission path. If there is an impedance match between the impedance $Z_{g0}$ at the output end of the high-frequency power supply device, and the impedance $Z_{amp}$ viewed from the high-frequency amplifier circuit within the high-frequency power supply device, the impedance $Z_{amp}$ viewed from the high-frequency amplifier circuit corresponds to the impedance $Z_{g0}$ at the output end.

Therefore, if the electrical length within the high-frequency power supply device is already known, the load impedance $Z_L$ is used instead of the impedance $Z_{amp}$, thereby obtaining the electrical length l of the transmission path that maximizes the load voltage $V_L$. Furthermore, since the magnitude of the electrode voltage $V_{pp}$ is proportional to the load voltage $V_L$, it is possible to obtain the electrical length l of the transmission path that maximizes the electrode voltage $V_{pp}$.

In the Smith chart of FIG. 18C, m1 ($\Gamma=0.998 \angle 32.352$ degree angle) indicates a voltage reflection coefficient $\Gamma$ in association with the load impedance $Z_L$ when plasma is extinguished, and m2 indicates the voltage reflection coefficient $\Gamma$ when the impedance $Z_{amp}$ is short-circuited and its phase angle is 180 degree angle. In addition, m3 indicates the voltage reflection coefficient $\Gamma$ when the impedance is $\infty$. The example illustrates that the electrical length l of the transmission path between the load impedance $Z_L$ and the impedance $Z_{amp}$ of the high-frequency amplifier circuit is 106 degree angle (=180 degree angle +32 degree angle/2).

FIG. 18A illustrates the electrode voltage $V_{PP}$ at the position of the electrical length l of the transmission path, with respect to m1. The electrode voltage $V_{PP}$ at the steady time indicates a constant value 200 V irrespective of the electrical length l of the transmission path. On the other hand, the electrode voltage $V_{pp}$, when plasma is extinguished, significantly varies depending on the electrical length l of the transmission path, indicating that when the electrical length l is at the angle of 106 degree angle (at the position indicated by m2), the electrode voltage $V_{pp}$ becomes approximately $5 \times 10^4$ V at the maximum, which is around 25 times larger than the voltage at the steady time.

Typically, a vacuum chamber is not designed in a manner as having resistance to such high voltage being 25 times higher than the voltage at the steady time, and therefore generation of this excessive electrode voltage $V_{pp}$ may cause arching.

FIG. 18B illustrates the absolute value $|Z_{amp}|$ of the impedance $Z_{amp}$ at the position of the electrical length l of the transmission path, with respect to m1. The absolute value $|Z_{amp}|$ of the impedance $Z_{amp}$ varies depending on the electrical length l of the transmission path, indicating that the absolute value $|Z_{amp}|$ is locally minimized when the electrical length l corresponds to the position of 106 degree angle (the position indicated by m2). Therefore, m2 corresponds to the position where the absolute value $|Z_{amp}|$ of the impedance $Z_{amp}$ viewed from the high-frequency amplifier circuit is locally minimized.

In FIG. 18A and FIG. 18B, the position where the electrical length of the transmission path corresponds to 0 degree angle indicates the position where the load impedance $Z_L$ is open and the voltage reflection coefficient Γ is m1, and the position where the electrical length of the transmission path is 106 degree angle indicates the position where the impedance $Z_{amp}$ is short-circuited and voltage reflection coefficient Γ is m2.

According to the aforementioned relationship between the electrical length of the transmission path and voltage, by configuring the electrical length l of the transmission path in such a manner as preventing the impedance $Z_{amp}$ from being short-circuited, it is possible to assume that the electrode voltage $V_{pp}$ is avoided to approach an excessive voltage. However, the electrical length l of the transmission path may vary depending on the length of the transmission path, fluctuations of a distributed constant, and the like. Therefore, it is difficult to match the length of a cable actually installed, to the electrical length l being provided. And further, as the fluctuations of the distribution constant may change the electrical length, it is also difficult to avoid stably that the electrode voltage $V_{pp}$ approaches excessive voltage.

It is known that a standing wave is generated by a reflected wave due to an impedance mismatch, and when amplitude of the standing wave has the local maximal value, the voltage raised by the impedance mismatch becomes more readily approach an excessive voltage.

FIG. 19 is a schematic view illustrating the state of the standing wave at the time of matching and mismatching; FIG. 19A illustrates the state of matching, FIG. 19B illustrates the state of mismatching where the load is short-circuited and the reflection coefficient of the load impedance $Z_L$ is −1, and FIG. 19C illustrates the mismatching state where the load is open and the reflection coefficient of the load impedance $Z_L$ is 1. As for the voltage and current in FIG. 19A, FIG. 19B, and FIG. 19C, the voltage is shown by a solid line and the current is shown by a broken line, when the ends of the transmission path are short-circuited.

At the time of matching, no standing wave is generated, and at the time of mismatching, a standing wave is generated. As for the standing wave generated in the short-circuited load and the standing wave generated in the open state, nodes and antinodes of one standing wave are positioned in such a manner as opposed to the node and antinode of the other standing wave.

When the characteristic impedance $Z_0$ of the transmission path is 50Ω, if the load is terminated with 50Ω, voltage and current to the transmission path are constant irrespective of the electrical length. Therefore, any standing wave is not generated. On the other hand, if the load is short-circuited, voltage becomes zero and current is locally maximized at the end of the load side of the transmission path, forming a node of the standing wave. If the load is open, current becomes zero and voltage is locally maximized at the end of the load side of the transmission path, forming an antinode of the standing wave.

As described above, the load voltage $V_L$ in the load impedance $Z_L$ rises according to the impedance mismatching of the transmission path, and when a position on the transmission path corresponds to the antinode of the standing wave, a voltage rise may become much more excessive.

(Configuration of the Present Invention)

The present invention has a configuration that a parallel impedance is provided for the load impedance, on the transmission path between the high-frequency amplifier circuit of the high-frequency power supply device and the high-frequency load, thereby reducing impedance at a connecting position and preventing generation of excessive voltage on the transmission path, and further regenerating high-frequency power from the transmission path by the parallel impedance, thereby enhancing energy efficiency.

As a function usually provided in a circulator, there is known a configuration that separates a forward wave from a reflected wave, and provides directionality in the conduction direction respectively of the forward wave and the reflected wave. On the other hand, the function provided in the circulator of the present invention does not relate to the forward wave nor the reflective wave of a general circulator, but the function of the present invention may cause branching of current from the transmission path, making the branched current thus conduct with a directionality. In the present invention, the term of "circulator" is used from a viewpoint of the function that brings current with directionality into conduction.

The present invention includes aspects of a regeneration circulator, a high-frequency power supply device, and a method of regenerating high-frequency power, and any of those aspects are provided with common technical items relating to the regeneration circulator. Each of the aspects of the present invention is commonly provided with technical items relating to the regeneration circulator which changes the impedance state at a predetermined position on the transmission path, thereby reducing a rise of a voltage standing wave ratio by changing the voltage state of the standing wave, as well as regenerating power from the transmission path.

(Aspect of the Regeneration Circulator)

The regeneration circulator of the present invention is provided with a regenerating function, having a configuration to change the state of impedance at a predetermined position on a transmission path, thereby preventing a rise of a voltage standing wave ratio, by changing the voltage state of the standing wave, together with regenerating power from the transmission path.

The regeneration circulator of the present invention is to regenerate high-frequency power from the transmission path between the high-frequency amplifier circuit of the high-frequency power supply device and the high-frequency load, where an input end of the regeneration circulator is connected to the transmission path, configuring a parallel impedance for the transmission path, on the basis of a comparison between the voltage at the input end of the regeneration circulator and set voltage. The parallel impedance incorporates high-frequency power in one direction from the connecting position on the transmission path, and then regenerates the power.

The regeneration circulator returns power that is regenerated from the transmission path to the high-frequency power supply device, and in addition, it is further possible to supply power to other device including a power generator, and to store electricity in an electrical storage device.

Functions of Parallel Impedance in the Regeneration Circulator:

Parallel impedance in the regeneration circulator will be described. On the transmission path, in the state of impedance matching, voltage at the input end of the regeneration circulator is in the state of steady voltage, and therefore the voltage is lower, relative to the set voltage. In this voltage state, current is not conducted from the transmission path to the regeneration circulator side, and the regeneration circulator does not constitute parallel impedance for the transmission path.

On the other hand, on the transmission path, generation of the standing wave raises the voltage at the input end of the regeneration circulator, and the voltage may become higher, relative to the set voltage. In the state where the voltage is raised, the current is conducted from the transmission path to the regeneration circulator side, and the regeneration circulator configures the parallel impedance for the transmission path. Impedance mismatching may be a factor for generating the standing wave, but even when impedance is in the state of mismatching, there is a possibility that the voltage at the input end of the regeneration circulator does not rise depending on the load impedance and an electrical length of a transmission line.

The parallel impedance connected to the transmission path may change the state of the impedance state, caused by the standing wave on the transmission path, and lower a voltage standing wave ratio (VSWR), thereby preventing a rise of voltage.

In addition, the parallel impedance is able to regenerate power by incorporating current from the transmission path.

Modes of Connecting Position of the Regeneration Circulator:

The regeneration circulator has plural configuration modes as to a position for connecting its input end on the transmission path.

First Mode:

The first mode of position to which the input end of the regeneration circulator is connected corresponds to a position of one of antinode parts of a standing wave that is generated by an impedance mismatching on the transmission path. On the transmission path, when the standing wave is generated due to the impedance mismatching, voltage becomes high at the antinode parts, whereas it becomes low at node parts.

On the transmission path, by connecting the input end of the regeneration circulator to the antinode part where high voltage is generated, the regeneration circulator incorporates current from the high voltage part on the transmission path, and when the voltage being incorporated exceeds the set voltage, parallel impedance may be established for the transmission path.

Second Mode:

The second mode of position to which the input end of the regeneration circulator is connected corresponds to a position indicating an odd multiple of the electrical length being one-fourth wavelength ($\lambda/4$) of the high-frequency wavelength ($\lambda$) that is outputted by the high-frequency power source on the transmission path, the length starting from the output of the high-frequency amplifier circuit.

On the transmission path, the input end of the regeneration circulator is connected to the position of the electrical length where high voltage is generated, whereby the regeneration circulator incorporates current from the high voltage part on the transmission path, and then, the parallel impedance can be established for the transmission path, when the voltage being incorporated exceeds the set voltage.

The regeneration circulator of the present invention is provided with a directional coupler configured to incorporate high-frequency power in one direction from the transmission path. The directional coupler incorporates high-frequency power from the transmission path, on the basis of a comparison between the voltage at the input end of the regeneration circulator and the set voltage, and configures an upper limit of the voltage at the input end of the regeneration circulator, as the set voltage during the regenerative operation.

A first mode of the directional coupler according to the present invention is provided with a transformer. A turn ratio of the transformer is a value that is based on a voltage ratio of the set voltage and the voltage at the output end of the regeneration circulator. Therefore, the set voltage is determined by the turn ratio of the transformer, and the voltage at the output end of the regeneration circulator.

When the turn ratio of the transformer is 1:1 (=primary turns:secondary turns), the set voltage is determined according to the voltage at the output end of the regeneration circulator.

A second mode of the directional coupler has a configuration that is provided with a rectifier configured to convert AC into DC, in addition to the transformer of the first mode. The rectifier converts the AC output from the transformer into DC, and regenerates the DC thus converted. In the first mode and the second mode, it is further possible to configure such that a capacitor is provided on the secondary side of the transformer, a DC reactor is provided on a subsequent stage of the rectifier, or the capacitor is provided on the secondary side of the transformer together with the DC reactor in the subsequent stage of the rectifier. The capacitor provided on the secondary side of the transformer or the DC reactor provided in the subsequent stage of the rectifier may remove a noise component. It is possible to install the capacitor on a diode bridge that constitutes the rectifier.

(Aspect of the High-Frequency Power Supply Device)

The high-frequency power supply device of the present invention is provided with a high-frequency power source configured to feed high-frequency power into a high-frequency load, and a regeneration circulator configured to incorporate high-frequency power in one direction from a transmission path between a high-frequency amplifier circuit provided in a high-frequency power supply device and the high-frequency load, for regenerating power. The regeneration circulator of the present invention is provided in the high-frequency power supply device, and an input end of the regeneration circulator is connected to the transmission path, and on the basis of comparison between the voltage at the input end of the regeneration circulator and the set voltage, the circulator establishes a parallel impedance for the transmission path. Then, the parallel impedance incorporates high-frequency power from the connecting position and regenerates the power.

The regeneration circulator provided in the high-frequency power supply device of the present invention may have the same aspect as the regeneration circulator that is described above.

(Aspect of High-Frequency Power Regeneration Method)

The method of regenerating high-frequency power of the present invention is to regenerate high-frequency power by a regeneration circulator from a transmission path between a high-frequency amplifier circuit of a high-frequency power supply device and a high-frequency load, and in the method, an input end of the regeneration circulator is connected to the transmission path, configuring a parallel impedance for the transmission path, on the basis of comparison between voltage at the input end of the regeneration circulator and the set voltage, and the parallel impedance incorporates high-frequency power from the connecting position and regenerates the power.

In the high-frequency power regeneration method of the present invention, the regeneration circulator may have the same aspect as the regeneration circulator that is described above.

(First Mode)

In the first mode of the high-frequency power regeneration method, the input end of the regeneration circulator is connected to a position of one of antinode parts of a standing wave that is caused by an impedance mismatching on the transmission path, and a parallel impedance is established for the transmission path on the basis of comparison between the voltage at the input end of the regeneration circulator and the set voltage, incorporating high-frequency power from the connecting position and regenerating the power according to the parallel impedance.

(Second Mode)

In the second mode of the high-frequency power regeneration method of the present invention, the input end of the regeneration circulator is connected to a position on the transmission path, indicating an odd multiple of an electrical length being one-fourth ($\lambda$/4) of the high-frequency waveform ($\lambda$) of high-frequency power outputted from the high-frequency power source on the transmission path, the length starting from the output end of the amplifier circuit, a parallel impedance is established for the transmission path on the basis of comparison between voltage at the input end of the regeneration circulator and the set voltage, and high-frequency power is incorporated by the parallel impedance in one direction from the connecting position and the power is regenerated.

In the first and the second modes, high-frequency power is incorporated from the transmission path by the parallel impedance, on the basis of the comparison between the voltage at the input end of the regenerative circular and the set voltage, and an upper limit of the voltage at the input end of the regeneration circulator is configured as the set voltage during the regenerative operation. In addition, the AC output of the high-frequency power is converted into DC, and thereafter the power is regenerated.

Advantages of the Invention

As described above, according to the present invention, it is possible to prevent an excessive rise of load voltage, which is caused by the impedance mismatching on the transmission path. It is also possible to regenerate high-frequency power.

BRIEF DESCRIPTION OF THE DRAWINGS

FIG. 9 illustrates a circuit example of the high-frequency power supply device and the regeneration circulator;

FIG. 11 illustrates waveforms of voltage and current at each portion of the high-frequency power supply device in the time domain;

FIG. 14 illustrates a relationship between regenerative-operation starting voltage $V_{p-regen}$ and voltage $V_{P-Z0}$;

FIG. 16 illustrates a variation example of output power with respect to variation of impedance $Z_{amp}$;

FIG. 17 illustrates a circuit example of the class-D high-frequency power supply device;

FIG. 18 illustrates electrode voltage, an impedance, a reflection coefficient ratio with respect to the electrical length; and FIG. 19 are schematic views showing the state of standing waves at the time of matching and mismatching.

BEST MODE FOR CARRYING OUT THE INVENTION

With reference to FIGS. 1 to 4, there will be described a regeneration circulator and a high-frequency power supply device incorporating the regeneration circulator, according to the present invention.

(Configuration of the Present Invention)

Figure 1:
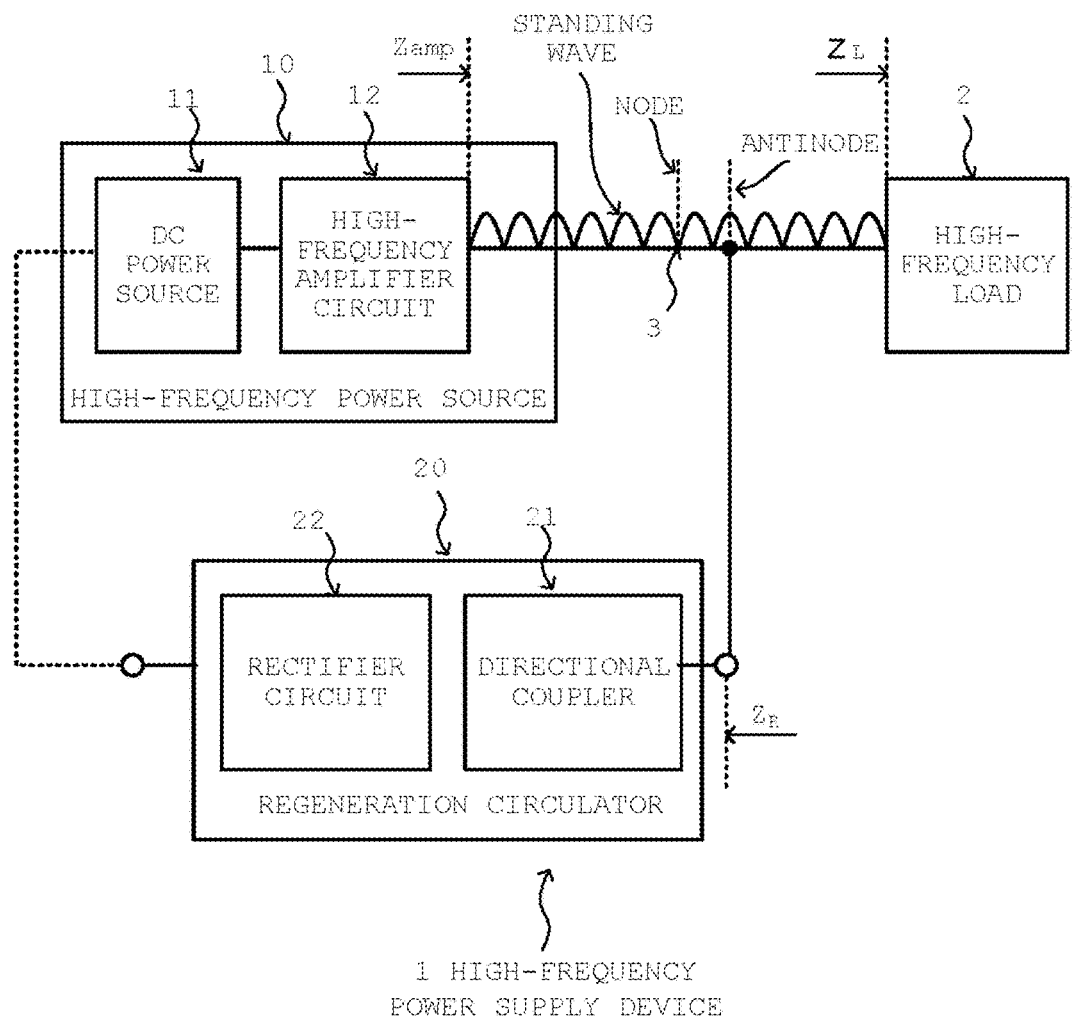
FIG. 1 is a schematic view illustrating a configuration of a regeneration circulator and a high-frequency power supply device of the present invention.

FIG. 1 is a schematic view illustrating a configuration of the regeneration circulator and the high-frequency power supply device of the present invention.

The high-frequency power supply device 1 is provided with a high-frequency power source 10 and a regeneration circulator 20, and the regeneration circulator 20 being connected to a transmission path 3 of the high-frequency power source 10, establishes a parallel impedance for the transmission path 3, and incorporates power from the transmission path 3 for regenerating power. Regeneration by the regeneration circulator 20 may be executed by returning the incorporated power to the high-frequency power source 10, and in addition, by feeding power into a device not illustrated, or by storing electric power in a storing device not illustrated.

By way of example, a DC power source 11 and a high-frequency amplifier circuit 12 may constitute the high-frequency power source 10. The high-frequency amplifier circuit 12 performs DC/RF conversion to convert direct current from the DC power source 11 into a high-frequency wave, and raises voltage to output a high-frequency output. The high-frequency output is supplied to a high-frequency load 2 via the transmission path 3.

The transmission path 3 is a transmission line for supplying power from the output end of the high-frequency amplifier circuit 12 to the input end of the high-frequency load 2, and it may be formed of a power cable disposed between the high-frequency power source 10 and the high-frequency load 2, and wiring and a circuit configuration in the high-frequency power source 10.

On the transmission path 3, if there is a matching between a characteristic impedance of the transmission path and the impedance of the high-frequency load 2, a forward wave outputted from the high-frequency amplifier circuit 12 may be supplied to the high-frequency load 2 without being reflected. On the other hand, if the impedance of the high-frequency load 2 varies, causing a mismatching between the characteristic impedance of the transmission path and the impedance of the high-frequency load 2, a part or all of the forward wave outputted from the high-frequency amplifier circuit 12 may be reflected, and the forward wave and the reflected wave may form a standing wave.

The regeneration circulator 20 has a function to establish conduction of current that branches from the transmission path 3, only in one direction; i.e., only in the direction toward the regeneration circulator 20. The circulator within the regeneration circulator represents a function for conducting current with a directionality.

The regeneration circulator 20 is provided with a regenerating function, in addition to the aforementioned circulator function. The regenerating function of the regeneration circulator 20 may vary the impedance state at a predetermined position on the transmission path 3, between the high-frequency amplifier circuit 12 of the high-frequency power source 10 and the high-frequency load 2, thereby changing the voltage state of the standing wave, and preventing a rise of a voltage standing wave ratio, together with regenerating high-frequency power from the transmission path. The input end of the regeneration circulator 20 is connected onto the transmission path 3, and establishes parallel impedance for the transmission path 3, on the basis of the comparison between the voltage at the input end of the regeneration circulator 20 and preset voltage. The parallel impedance incorporates high-frequency power in one direction from the connecting position on the transmission path 3, and regenerates the high-frequency power.

During an impedance matching on the transmission path 3, since the voltage at the input end of the regeneration circulator 20 is steady voltage, the voltage is lower relative to the set voltage. In the state of steady voltage, current is not conducted from the transmission path 3 toward the regeneration circulator 20 side, and therefore, the regeneration circulator 20 does not establish the parallel impedance for the transmission path 3.

When a standing wave is generated on the transmission path 3, the voltage at the input end of the regeneration circulator rises, and it may become higher relative to the set voltage. The standing wave is generated when an impedance mismatching occurs. The voltage at the input end of the regeneration circulator does not necessarily rise every time when the impedance mismatching occurs. There is a possibility that the voltage at the input end of the regeneration circulator is not raised even during the impedance mismatching, depending on the load impedance or an electrical length of the transmission line.

In the state where the voltage at the input end of the regeneration circulator is higher relative to the set voltage, current is conducted from the transmission path 3 to the regeneration circulator 20 side, and the regeneration circulator 20 establishes parallel impedance for the transmission path 3. The parallel impedance connected to the transmission path 3 may change the impedance state of the transmission path 3, so as to lower the voltage standing wave ratio (VSWR), to prevent a voltage rise, and to incorporates current from the transmission path 3, thereby regenerating power to the DC power source 11. It is to be noted that the power may be regenerated not only into the DC power source 11, but also into other DC power source or storage device.

The first embodiment and the second embodiment will now be described as to the example how the regeneration circulator is connected to the transmission path 3. A configuration example of the second embodiment corresponds to that of the first embodiment.

First Embodiment

FIG. 1 shows the first embodiment of a connection between the regeneration circulator and the transmission path. In the first embodiment, the input end of the regeneration circulator 20 is connected to a position corresponding to one of antinode parts of the standing wave that is generated by an impedance mismatching on the transmission path 3. When the standing wave is generated by the impedance mismatching on the transmission path 3, voltage becomes high at the antinode parts, whereas voltage becomes low at node parts. FIG. 1 shows a configuration example where the input end of the regeneration circulator 20 is connected to the antinode parts of the standing wave on the transmission path 3.

By connecting the input end of the regeneration circulator 20 to the antinode parts where high voltage is generated on the transmission path 3, the regeneration circulator 20 incorporates current from the antinode part on the transmission path 3, and when thus incorporated voltage exceeds the set voltage, parallel impedance is established for the transmission path 3.

Second Embodiment

Figure 2:
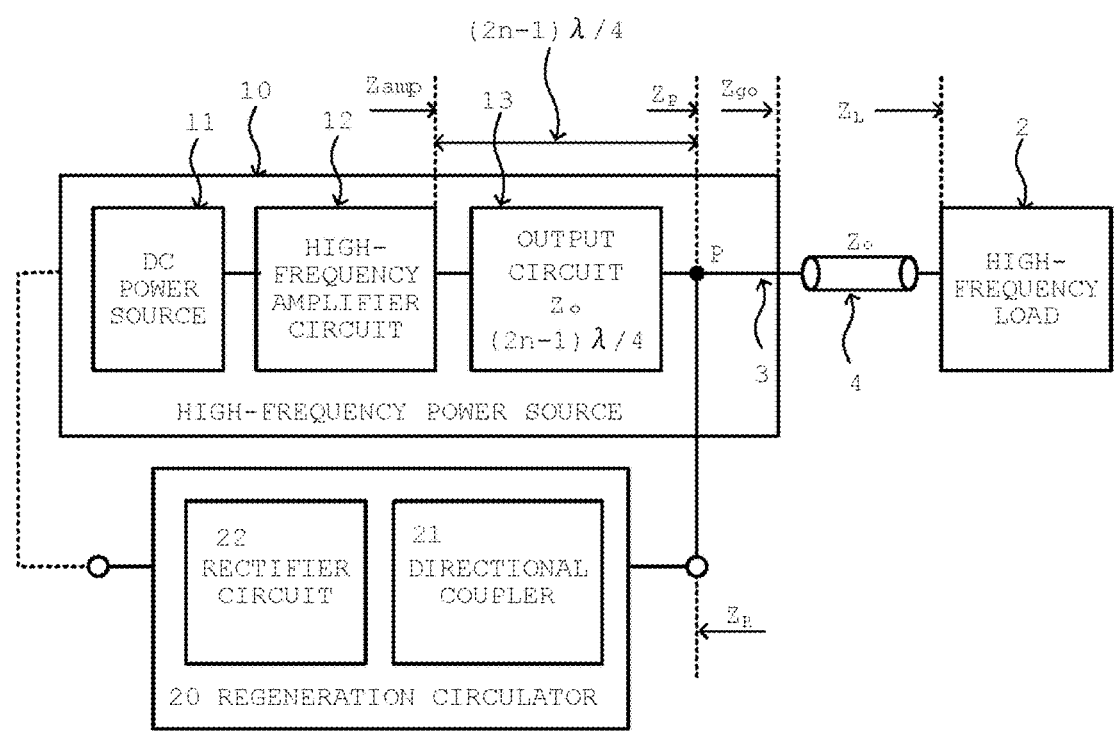
FIG. 2 is a schematic view illustrating a connecting position of an input end of the regeneration circulator.

FIG. 2 is a schematic view describing the second embodiment of the connection between the regeneration circulator and the transmission path, and FIG. 2 shows an example where the input end of the regeneration circulator is connected to a position indicating a predetermined electrical length from the output end of the high-frequency amplifier circuit. In FIG. 2, the connecting position of the input end of the regeneration circulator 20 is represented by P, and the impedance at the position P is represented by $Z_P$.

In FIG. 2, in a high-frequency power source 10 the transmission line 4 with the characteristic impedance $Z_0$ connects the high-frequency power source 10 with the high-frequency load 2, and the high-frequency amplifier circuit 12 is connected to an output circuit 13, provided with an impedance matching at $Z_0$. With this impedance matching at $Z_0$ in the output circuit 13, the impedance $Z_{amp}$ when viewing the load side from the high-frequency amplifier circuit 12, matches the impedance $Z_{g0}$ at the output end of the high-frequency power source 10.

When the high-frequency load is in a short-circuited state or in the open state, an impedance mismatching occurs on the transmission path, causing a reflected wave, and accordingly, a standing wave is formed. The second embodiment shows the state where the high-frequency load is short-circuited state.

The second embodiment is directed to reducing the standing wave that is generated when the end of the transmission path is in a short-circuited state, and the input end of the regeneration circulator 20 is connected to a position indicating an odd multiple of an electrical length being one-fourth wavelength ($\lambda/4$) of the high-frequency wavelength ($\lambda$) on the transmission path 3, the length starting from the output end (the position of impedance $Z_{amp}$) of the high-frequency amplifier circuit 12, and the high-frequency wave being outputted from the high-frequency power source 10.

FIG. 3 illustrates the case where the input end of the regeneration circulator 20 is connected to the position indicating an odd multiple of an electrical length being one-fourth wavelength ($\lambda/4$) of the high-frequency wavelength ($\lambda$), from the output end of the high-frequency amplifier circuit 12 on the transmission path 3. The connecting position is represented by $(2n-1)\lambda/4$, where n is integer.

Figure 3A:
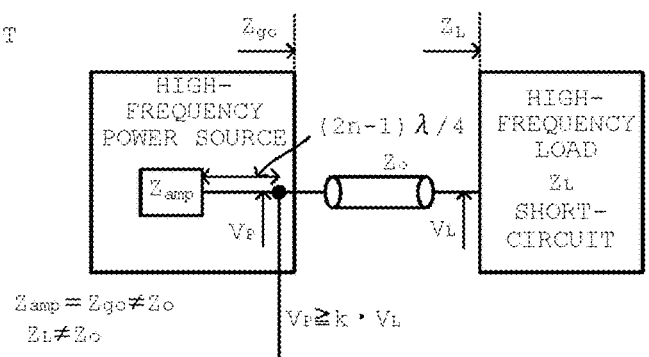
FIG. 3 is a schematic view illustrating a second mode of the connecting position of the input end of the regeneration circulator.
Figure 3B:
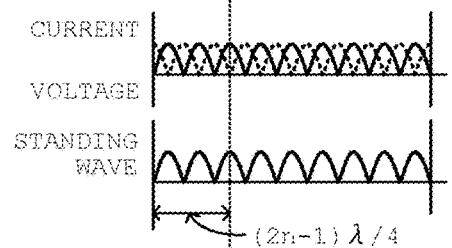
Figure 3C:
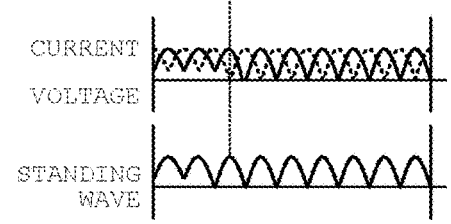

FIG. 3A illustrates the state where the regeneration circulator establishes a parallel impedance, when the impedance $Z_L$ of the high-frequency load is in a short-circuited state, FIG. 3B illustrates a standing wave that is generated when the impedance $Z_L$ of the high-frequency load is in a short-circuited state, and FIG. 3C shows a standing wave caused by the parallel impedance during the regenerative operation.

When the end of the transmission path is in a short-circuited state, an impedance mismatching occurs and a standing wave is generated. In this case, the position indicating an odd multiple of an electrical length being one-fourth wavelength ($\lambda/4$) of the high-frequency wavelength ($\lambda$) outputted from the high-frequency power source on the transmission path, corresponds to an antinode part of the standing wave, and therefore voltage is high. In here, the electrical length starts from the output end of the high-frequency amplifier circuit being the end point. As for the voltage and current shown in FIG. 3B and FIG. 3C, the voltage is indicated by a solid line and the current is indicated by a broken line when the end of the transmission path is short-circuited. FIG. 3B shows the state before regeneration, and FIG. 3C shows the state after regeneration.

The input end of the regeneration circulator is connected to the position indicating an electrical length where high voltage is generated on the transmission path, then the regeneration circulator incorporates current from the high voltage part on the transmission path, and establishes parallel impedance for the transmission path, when the incorporated voltage exceeds preset voltage. FIG. 3 shows an example where voltage being k-times larger than the voltage $V_L$ on the high-frequency load is assumed as the preset voltage. It is to be noted that the standing wave voltage is zero at the end being in a short-circuited. In this example, it is assumed that on the load side, the voltage at the position corresponding to the antinode part of the standing wave indicates voltage $V_L$ on the high-frequency load side.

The regeneration circulator being connected establishes the parallel impedance $Z_R$, and with this impedance, the peak value of the standing wave is reduced, and then the voltage $V_L$ on the high-frequency load side is also reduced.

FIG. 4 illustrates the regenerative operation according to the parallel impedance. In this example, the voltage being k-times larger than the load voltage $V_L$ is used as the set voltage for performing the regenerative operation. In FIG. 4A, the voltage $V_P$ at the connecting position P of the regeneration circulator corresponds to the steady voltage that is determined on the basis of the matched impedance, during the state of impedance matching, whereas during the mismatching state, the impedance $Z_{amp}$ at the output end of the high-frequency amplifier circuit is reduced from $Z_0$, resulting in a rise of voltage. When the voltage $V_P$ exceeds the set voltage $k \cdot V_L$, the regenerative operation of the regeneration circulator is started, and then current passes into the circulator from the transmission path (FIG. 4B).

Figure 4A:
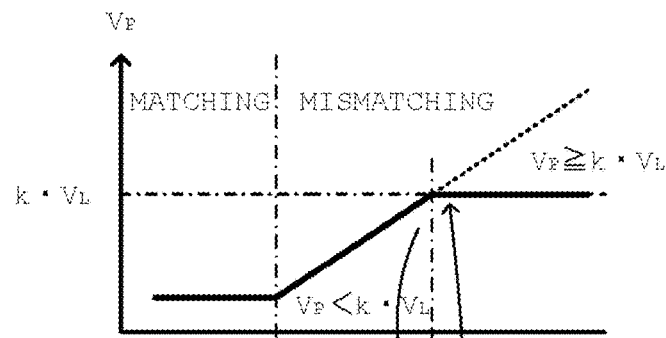
FIG. 4 illustrates a regenerative operation according to a parallel impedance.
Figure 4B:
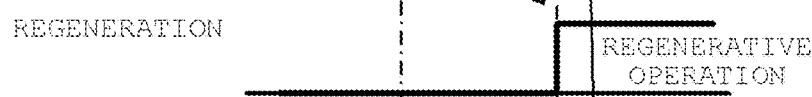
Figure 4C:
Figure 4D:

The regeneration circulator operates as the parallel impedance $Z_R$ according to the regenerative operation (FIG. 4C). When the parallel impedance $Z_R$ is connected to the impedance $Z_{g0}$ at the output end of the high-frequency power supply device, impedance is increased, and then, the impedance $Z_{amp}$ having been reduced at the output end of the high-frequency amplifier circuit is enabled to prevent a voltage rise of the voltage $V_P$ (FIG. 4D). It is to be noted that the impedance $Z_{amp}$ during the regenerative operation does not exceed the value that is obtained under normal operating conditions.

Configuration Example

With reference to FIGS. 5 to 8, a configuration example of the second embodiment will now be described, as to the regeneration circulator and the high-frequency power supply device.

Figure 5:
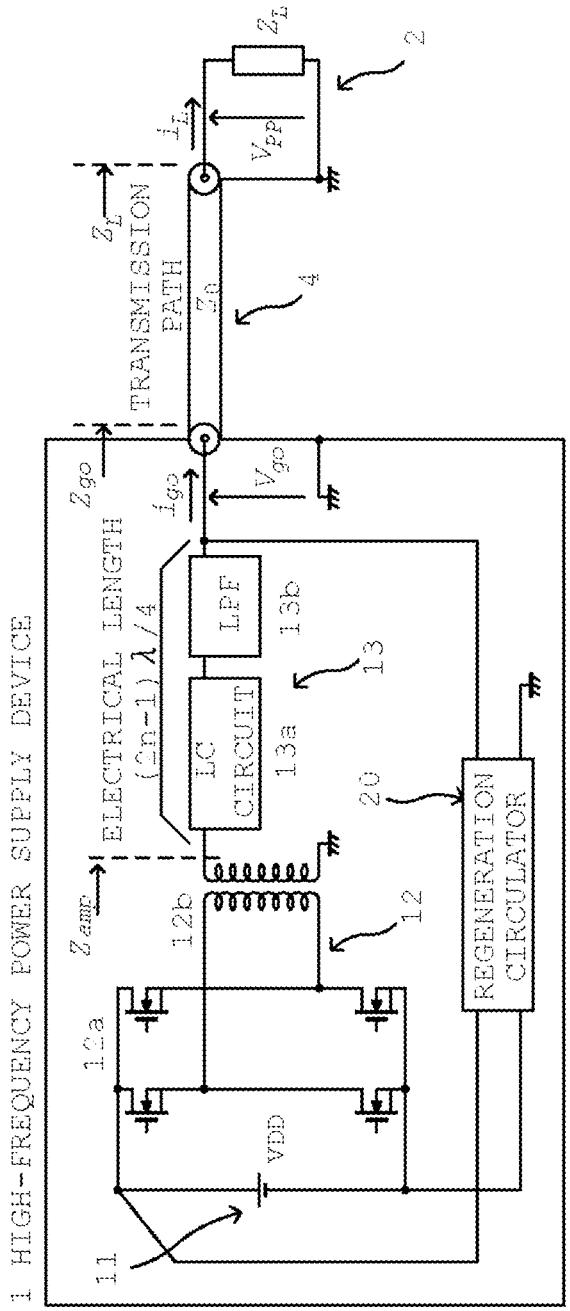
FIG. 5 illustrates a connection example of the input end of the regeneration circulator.

FIG. 5 illustrates a configuration example where the input end of the regeneration circulator 20 is connected at the position indicating the electrical length of $(2n-1)\lambda/4$ from the output end of the high-frequency amplifier circuit 12. In the high-frequency power supply device 1, a bridge circuit 12a of semiconductor switching elements and a transformer 12b constitute the high-frequency amplifier circuit 12. The output circuit 13 comprises a series connection circuit between a matching circuit 13a that performs impedance matching with the characteristic impedance $Z_0$ of the transmission line 4 and an LPF (low-pass filter) 13b for removing a noise component. An LC circuit, for instance, may constitute the matching circuit 13a. The LC circuit and the LPF (low-pass filter circuit) 13b are designed in such a manner that the electrical length becomes equal to $(2n-1)\lambda/4$.

When AC voltage at the input end of the regeneration circulator 20 exceeds a certain level, current starts to pass into the circuit of the regeneration circulator. Therefore, the load (impedance) is seemingly connected to the circuit of the regeneration circulator 20 in parallel, and accordingly, this leads to an operation to prevent the connecting position of the regeneration circulator from becoming high impedance. At the same time, this operation similarly indicates that the impedance $Z_{amp}$ at the point of the electrical length $(2n-1)\lambda/4$ from the regenerative circuit is prevented from becoming low impedance.

The regeneration circulator 20 is a circuit to start regenerating regeneration circulator power, and as shown in FIG. 1 and FIG. 2, it is provided with a directional coupler 21 for incorporating high-frequency power in one direction from the transmission path and a rectifier circuit 22. The directional coupler 21 incorporates high-frequency power from the transmission path, on the basis of comparison between the voltage at the input end of the regeneration circulator 20 and the set voltage, and during the regenerative operation, the upper limit of the voltage at the input end of the regeneration circulator is configured as the set voltage. The rectifier circuit 22 converts AC to DC, and regenerates the DC into a DC power source 11, and the like.

Figure 6:
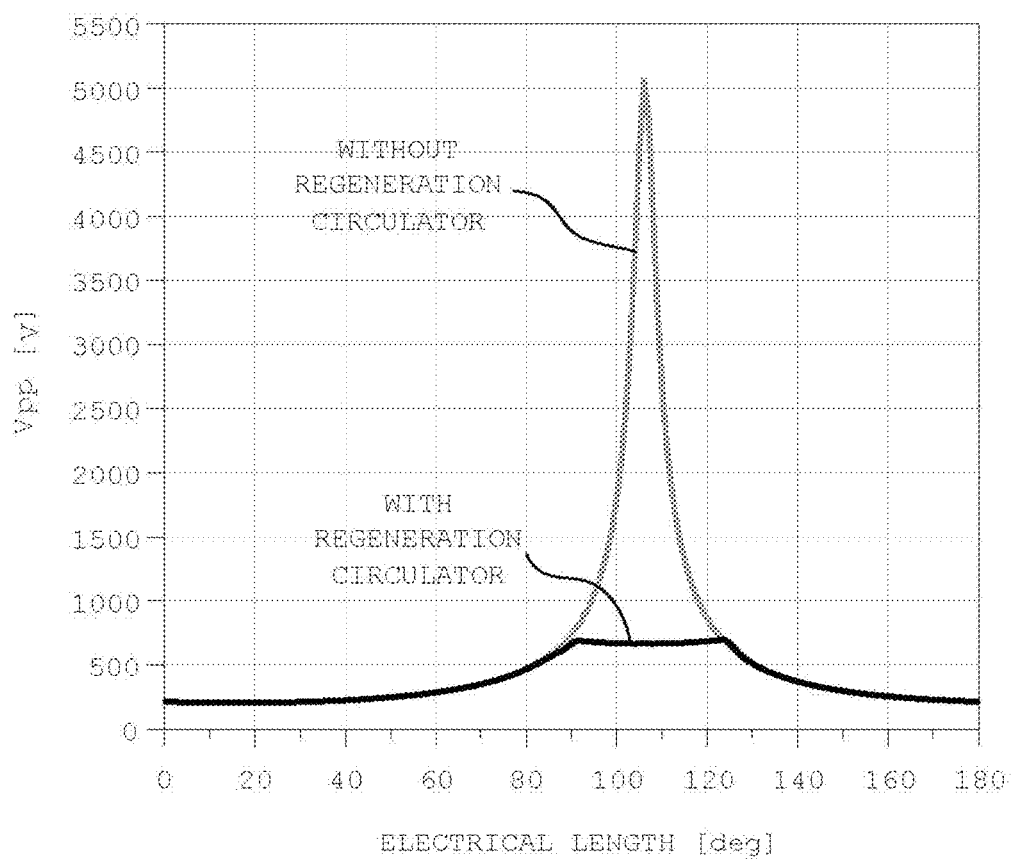
FIG. 6 illustrates variation of electrode voltage $V_{pp}$ with respect to an electrical length.

FIG. 6 shows that the high-frequency amplifier circuit including the transformer 12b with the turn ratio of 1:2 as shown in FIG. 5, is connected to a circuit of the output circuit 13, and assuming the case where plasma is extinguished with an active component of the load impedance $Z_L$ being 100 kΩ (≈Open), two situations are illustrated; one is when the regeneration circulator is provided, and the other is when it is not provided for the electrode voltage $V_{pp}$, where the electrical length l of the transmission path varies from 0 degree angle to 180 degree angle. The electrode voltage $V_{pp}$ in FIG. 6 indicates that the regenerative operation is performed within the range of the electrical length from approximately 85 degree angle to 125 degree angle, so as to reduce the electrode voltage $V_{pp}$.

Figure 7:
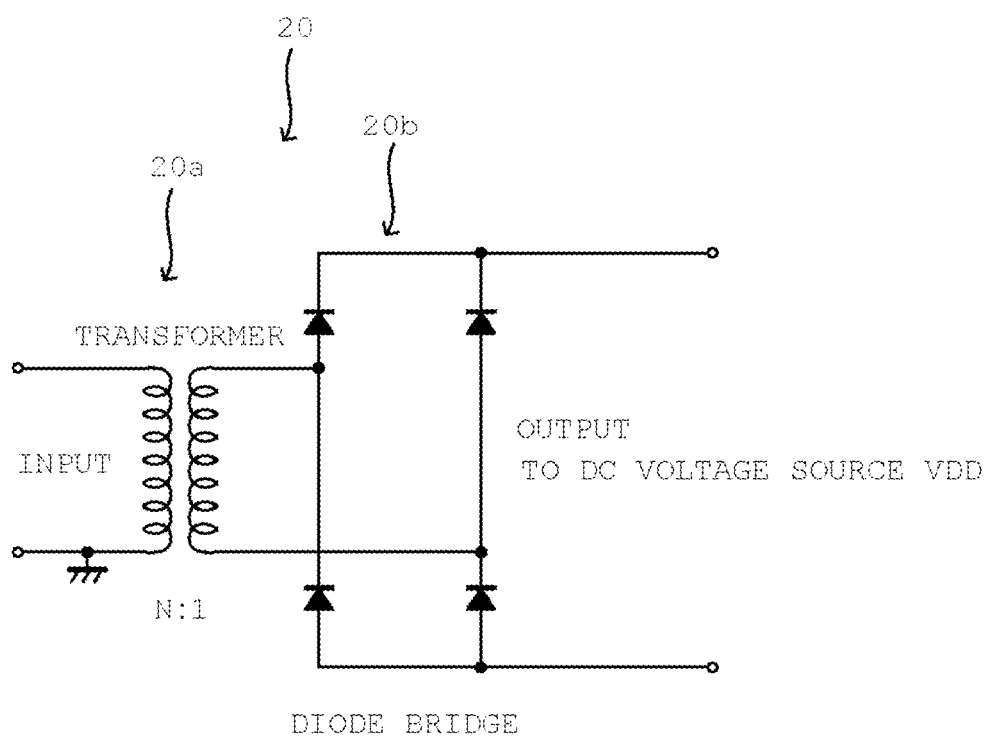
FIG. 7 illustrates a circuit example of the regeneration circulator.

FIG. 7 and FIG. 8 show circuit configurations of the regeneration circulator. In the circuit example as shown in FIG. 7, the regeneration circulator 20 is provided with a transformer 20a on the input side, and a rectifier 20b comprising a diode bridge circuit on the output side. The transformer 20a is associated with the directional coupler 21, and the rectifier 20b is associated with the rectifier circuit 22. By way of example, the output side is connected to a DC voltage source of the DC power source 11, thereby regenerating the DC power into the DC voltage source. It is to be noted that the DC power may be regenerated not only into the DC voltage source of the high-frequency power supply device, but also into other DC voltage source.

Figure 8A:
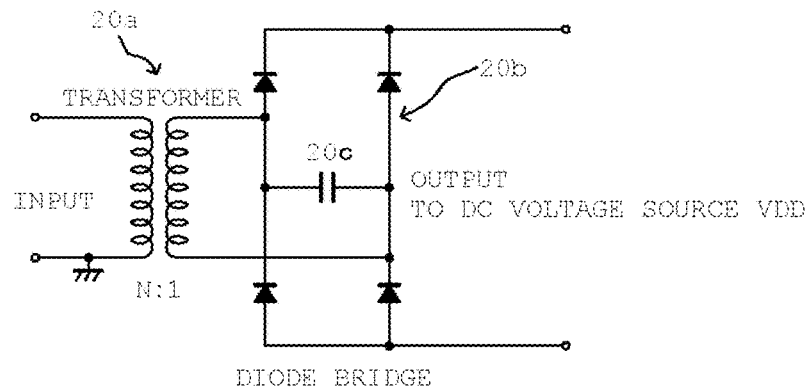
FIG. 8 illustrates circuit examples of the regeneration circulator.

FIG. 8 shows modified circuit examples of the regeneration circulator. The circuit example as shown in FIG. 8A connects a capacitor 20c to the secondary side of the transformer constituting the transformer 20a, thereby compensating for voltage-waveform distortion on the secondary side of the transformer, caused by a commutation overlap angle due to leaked current (leakage) passing through the transformer.

Figure 8B:
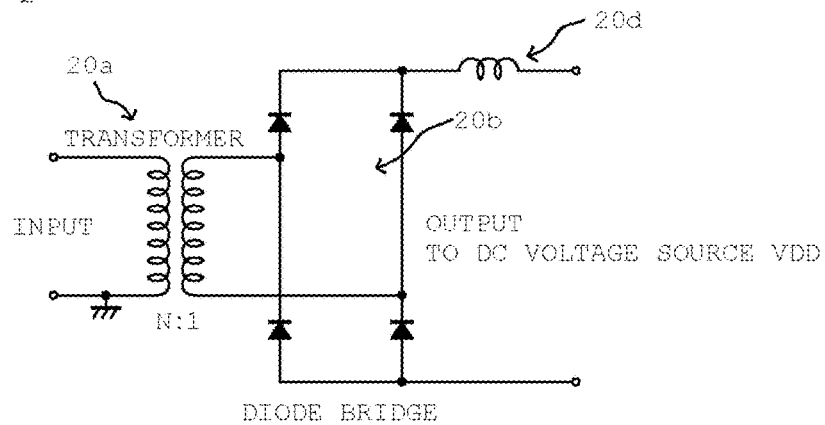
Figure 8C:
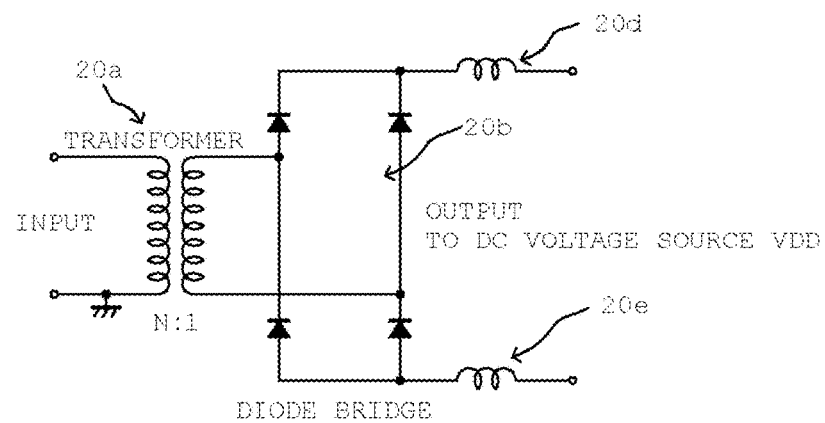

In the circuit examples as shown in FIG. 8B and FIG. 8C, inductances 20d and 20e are connected on the output side of the diode bridge, thereby reducing an AC component directed to the DC power source ($V_{DD}$) being a destination of regeneration. Another example may be possible where the capacitor in FIG. 8A and the inductance as shown in FIG. 8B or FIG. 8C are combined.

Operation Example

With reference to FIGS. 9 to 13, operation examples of the regeneration circulator of the present invention will now be described.

FIG. 9 is a circuit example of the high-frequency power supply device and the regeneration circulator. In the circuit example of FIG. 9, there are shown parameters as the following; in the steady state where plasma is ignited, and in the abnormal state where plasma is extinguished for the cases where the regeneration circulator is provided and not provided. It is to be noted that the load impedance $Z_L$ is 50Ω and the active component $R_L$ is 100Ω, when plasma is ignited.

[Steady State]
DC power source voltage $V_{DD}$: 290 V
Forward wave: 4,000 W (measured value at the output end of high-frequency power supply device)
Reflected wave: 0 W (measured value at the output end of high-frequency power supply device)
Output-end impedance $Z_{amp}$ of high-frequency amplifier circuit: 40+j20Ω
Voltage $V_{pp}$ of active components $R_L$ of load impedance: 1,794 V
Active component $R_L$ of load impedance: 100Ω
Output-end impedance $Z_{g0}$ of high-frequency power supply device: 50Ω

[Abnormal State: Regeneration Circulator is not Provided]
In the circuit example of FIG. 9, when the regeneration circulator is not provided, parameters in the abnormal state where plasma is extinguished are as the following. It is to be noted that the active component $R_L$ of the load impedance is 100 kΩ when plasma is extinguished.
DC power source voltage $V_{DD}$: 290 V
Forward wave: 49,000 W (Measured value at the output end of high-frequency power supply device)
Reflected wave: 49,000 W (Measured value at the output end of high-frequency power supply device)
Output-end impedance $Z_{amp}$ of high-frequency amplifier circuit: 0.05−j0.01Ω
Voltage $V_{pp}$ of active component $R_L$ of load impedance: 12,530 V
Active component $R_L$ of load impedance: 100 kΩ
Output-end impedance $Z_{g0}$ of high-frequency power supply device: open (40 kΩ)

Figure 10:
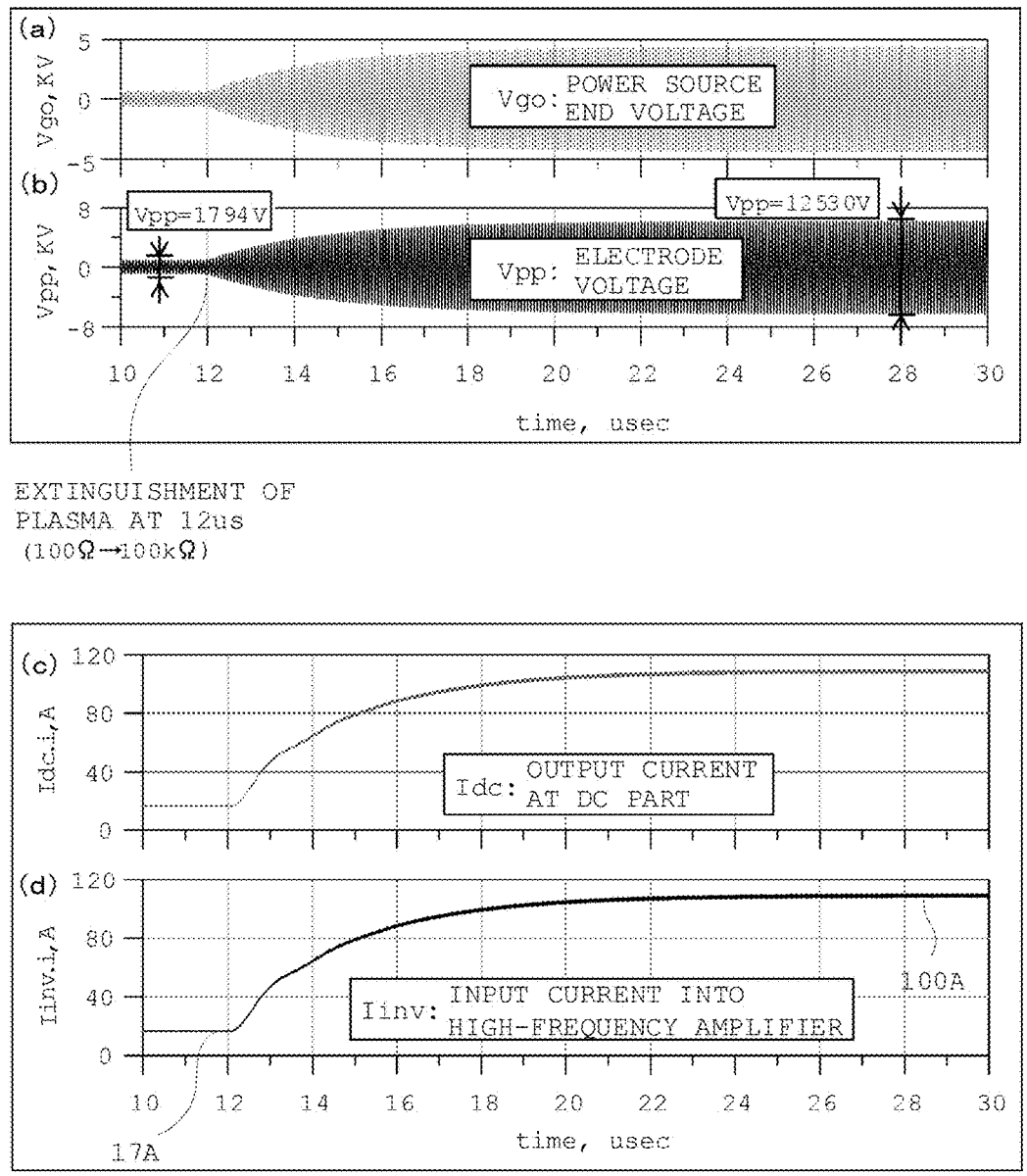
FIG. 10 illustrates waveforms of voltage and current at each portion of the high-frequency power supply device in a time domain.

FIG. 10 shows waveforms within a time domain, respectively of the output-end voltage $V_{g0}$ of the high-frequency power supply device, the electrode voltage $V_{pp}$, the output current $I_{dc}$ from the DC power source, and the input voltage $I_{inv}$ into the high-frequency amplifier circuit. FIG. 10 illustrates data when plasma is extinguished at t=12 us.

In the case where the regeneration circulator is not provided, output power of 49 kW is outputted to 4-kW rated power source, and there is a possibility that power amplifier element is broken due to over voltage or excessive loss. In addition, the electrode voltage $V_{pp}$ at the steady time is 1,794 V, whereas at the abnormal time, high voltage of 12,530 V is applied to the electrodes within the vacuum device, and there is a problem that this high voltage may be a factor of arching generation due to an electrode fracture or dielectric breakdown.

[Abnormal State: Regeneration Circulator is Provided]
In the circuit example as shown in FIG. 9, when the regeneration circulator is provided, parameters in the abnormal state where plasma is extinguished are as the following. When plasma is extinguished, the active component $R_L$ of the load impedance is assumed as 100 kΩ.
DC power source voltage $V_{DD}$: 290 V
Forward wave: 4,000 W (measured value at the output end of high-frequency power supply device)
Reflected wave: 4,000 W (measured value at the output end of high-frequency power supply device)
Output-end impedance $Z_{amp}$ of high-frequency amplifier circuit: 18.9+j6.0Ω
Voltage $V_{pp}$ of active component $R_L$ of load impedance: 3,560 V
Active component $R_L$ of load impedance: 100 kΩ
Output-end impedance $Z_{g0}$ of high-frequency power supply device: open (40 kΩ)

FIG. 11 shows waveforms within the time domain, respectively of the output-end voltage $V_{g0}$ of the high-frequency power supply device, the electrode voltage $V_{pp}$, the output current $I_{dc}$ of the DC power source, and the input voltage $I_{inv}$ into the high-frequency amplifier circuit. FIG. 11 illustrates data when plasma extinguished at t=12 us.

Figure 12A:
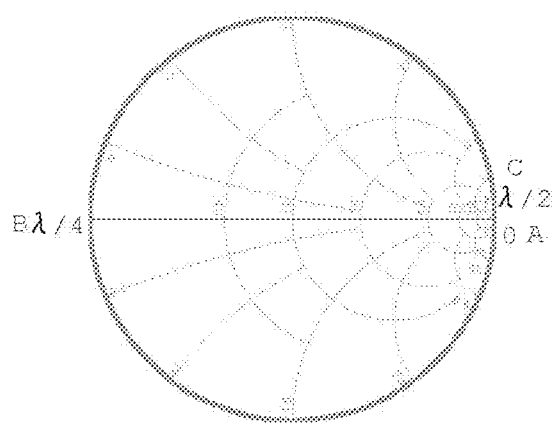
FIG. 12 is a Smith chart showing an impedance locus of an output-end impedance $Z_{amp}$.
Figure 12B:
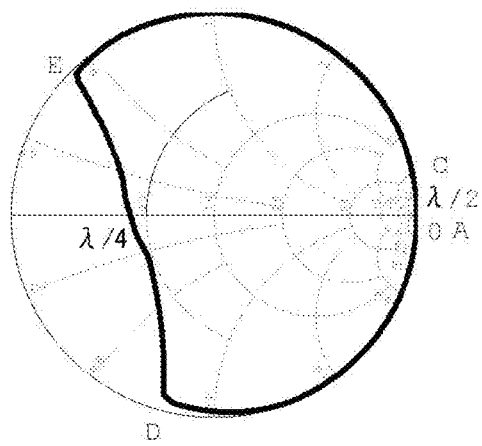
Figure 13:
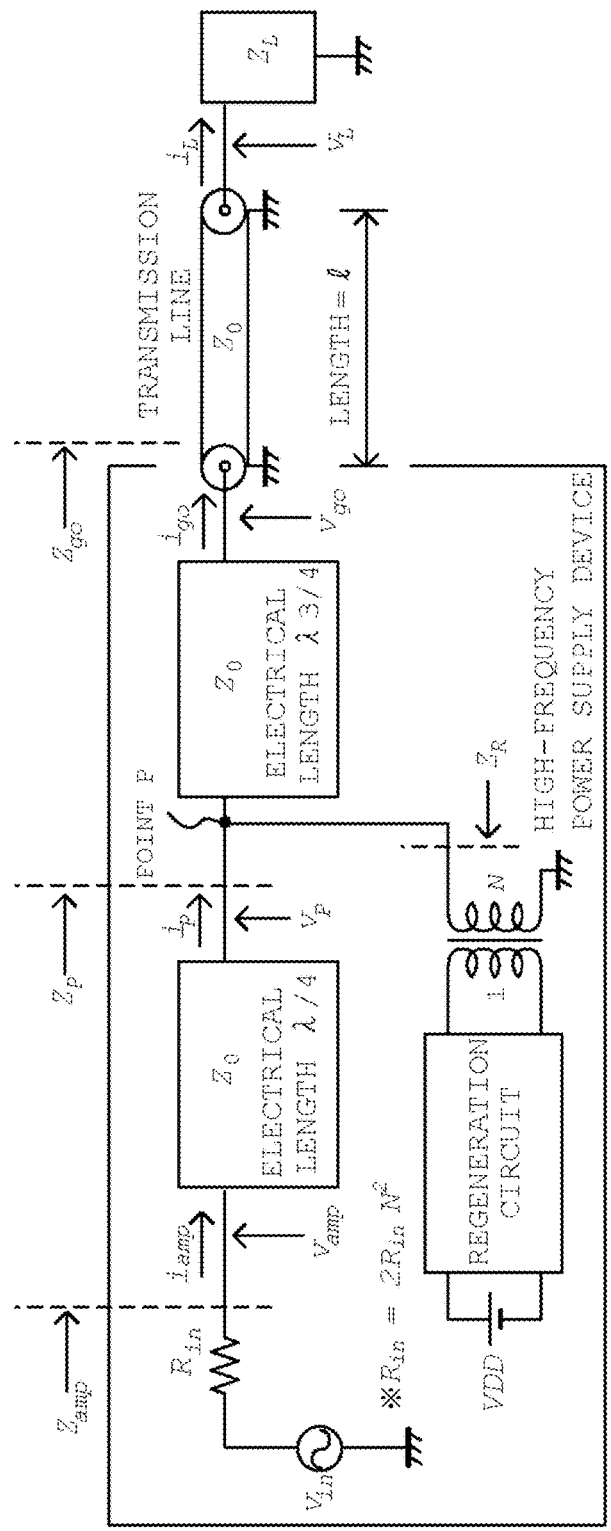
FIG. 13 is a circuit example of the high-frequency power supply device.
Figure 15A:
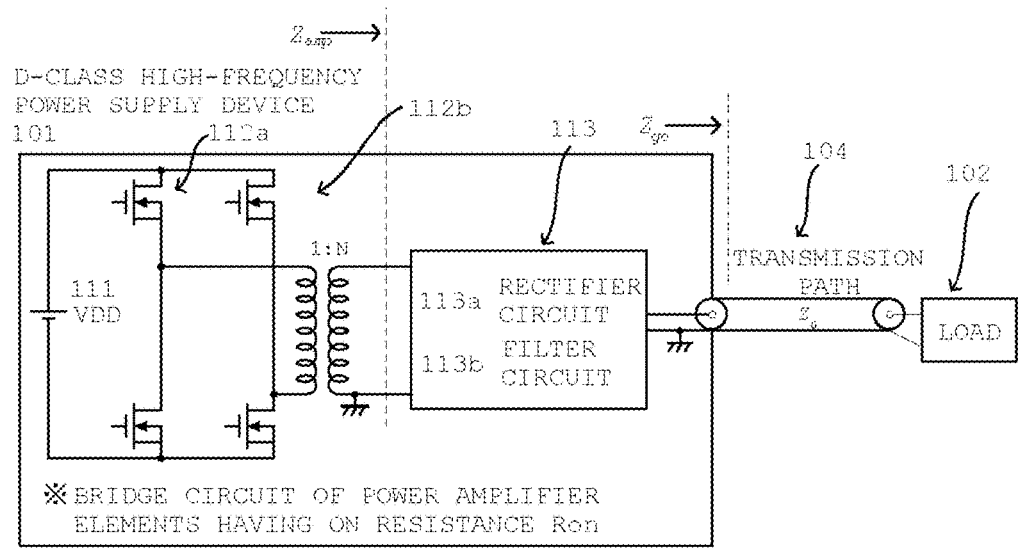
FIG. 15 illustrates a circuit example of a class-D high-frequency power supply device.
Figure 15B:
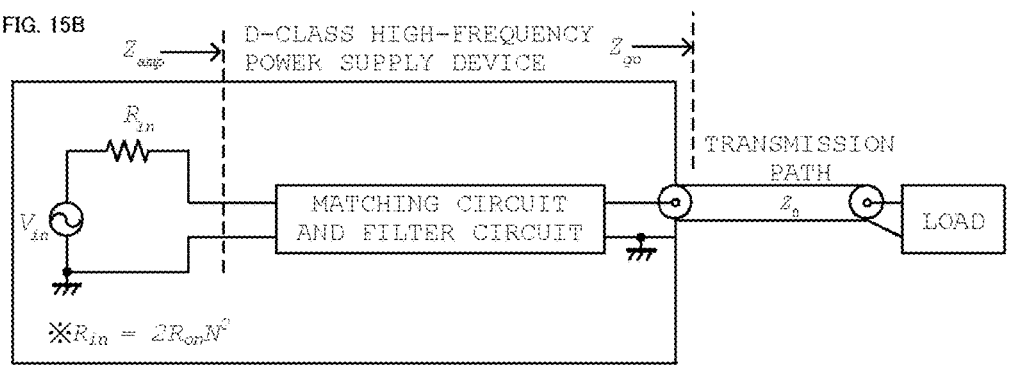

FIG. 12 illustrates on the Smith chart, an impedance locus of the output end impedance $Z_{amp}$ with respect to the electrical length of the transmission line. FIG. 12A shows variation of the output end impedance $Z_{amp}$ when plasma is extinguished, without the regeneration circulator. FIG. 12B shows variation of the output end impedance $Z_{amp}$ when plasma is extinguished, with the regeneration circulator being provided.

In FIG. 12A, the reference symbols A, B, and C correspond to the impedance, respectively when the electrical length is 0, λ/4, and λ/2, and in accordance with the variation of the electrical length from 0 to λ/2, the impedance varies in the order of A, B, and C.

Since there is a relationship of λ/4 in electrical length, between the antinode part and the node part of the standing wave, the load-end voltage is maximized when the load end is located at the position corresponding to the antinode part of the standing wave. In this situation, the impedance $Z_{amp}$ viewed from the high-frequency amplifier circuit, in association with the node part of the standing wave is low impedance, which corresponds to the impedance in the short-circuited state. Since the load end voltage is proportional to the electrode voltage, when the electrode voltage is maximized, the impedance $Z_{amp}$ becomes low.

In FIG. 12A, when the load end voltage (electrode voltage) is maximized, the impedance at the load end is located at the electrical length A, and the impedance $Z_{amp}$ viewed from the high-frequency amplifier circuit is located at the electrical length B, moved only by λ/4 from the position A. The impedance of the electrical length B is zero, and this corresponds to the short-circuited state.

Therefore, observing the impedance $Z_{amp}$ viewed from the high-frequency amplifier circuit, when the impedance $Z_{amp}$ is located at the electrical length B where the impedance is zero, the impedance at the load end is located at the electrical length A, where the impedance corresponds to ∞, and the load end voltage (electrode voltage) increases.

In FIG. 12B, the reference symbols A and C correspond to the impedance, respectively when the electrical length is zero 0 and λ/2, D corresponds to the impedance when the electrical length is between 0 and λ/4, E corresponds to the impedance when the electrical length is between λ/4 and λ/2, and the impedance varies in the order of A, D, E, and C, along with the variation of the electrical length from 0 to λ/2.

In the configuration where the regeneration circulator is provided, when the impedance $Z_{amp}$ is coming into the short-circuited state, between 0 and λ/4, the parallel impedance becomes connected to the transmission path at the electrical length D. Then, another active component may be generated, in addition to those provided in the load impedance, and the impedance may vary along with the impedance locus that avoids the low impedance point at the electrical length B.

When the impedance $Z_{amp}$ returns from the short-circuited state to the open state, between λ/4 and λ/2, the parallel impedance is disconnected from the transmission path, and the active component being generated disappears at the electrical length E, and the impedance varies toward the high impedance point at the electrical length C.

Therefore, with the regeneration circulator, it is possible to allow the output end impedance $Z_{amp}$ of the high-frequency amplifier circuit to be away from the low impedance of the short-circuited state.

Since the parallel impedance according to the regeneration circulator allows the impedance $Z_{amp}$ to be away from becoming low impedance, it is possible to prevent the load voltage $V_L$ and the electrode voltage $V_{pp}$ from boosting up to be a value several ten folds larger than a value in the steady state.

The active component caused by the parallel impedance is generated by resuming power in the DC power source voltage $V_{DD}$ via the regeneration circulator, and it is not generated by adding a loss component such as an internal dummy load. Therefore, it is possible to avoid a loss of energy being regenerated, thereby enhancing the regenerative efficiency.

In addition, the output power at the time of total reflection time is limited to 4,000 W, and as a result, the upper limit of the electrode voltage $V_{pp}$ is also restricted.

By setting the upper limit of the output power and voltage, it is possible to prevent a fracture of the power amplifier element, electrode breakage of the vacuum device, a fracture of a semiconductor element due to arching, and the like.

(Condition for Starting the Regenerative Operation)

As described above, the impedance state where the impedance $Z_{amp}$ viewed from the output end of the high-frequency amplifier circuit becomes low, is associated with a rise of the load end voltage caused by a standing wave. There will now be described an operating condition that prevents the impedance $Z_{amp}$ from becoming low according to the regenerative operation.

The class-D high-frequency power supply device generates a square wave by an inverter. In the circuit example of FIG. 13, the internal resistance $R_{in}$ is expressed by the following formula, where an effective value voltage of a basic wave component of the square wave voltage is $V_{in}$, on-resistance of the inverter is $R_{on}$, and the transformer turn ratio is N:

$$R_{in}=2R_{on}N^2 \qquad (1)$$

In this case, a relationship between an effective value voltage $V_{g0}$ and an effective value current $i_{g0}$ of high-frequency output is expressed as:

$$v_{amp}=v_{g0}=v_{in}-R_{in}i_{amp}=v_{in}-R_{in}i_{g0}$$

$$i_{amp}=i_{g0}$$

$$Z_{amp}=v_{amp}/i_{amp}=V_{g0}/i_{g0}=Z_{g0} \qquad (2)$$

Following formulas are established, where the effective value voltage on the load side at the coaxial cable length l is $V_L$, the effective value current is $i_L$, the transmission path length is $l=\lambda/4$ and $\beta l=\pi/2$, $V_L$ substitutes for $V_{L(\lambda/4)}$, assuming $V_{L(\lambda/4)}=V_{L-set}$ where $V_{L(\lambda/4)}$ is set as a reference vector:

$$v_{L-set}=v_{P-set}$$

$$i_{L-set}=i_{P-set}$$

$$Z_L=Z_P \qquad (3)$$

$$V_{g0(\lambda/4)}=j(V_{P-set}Z_0)/Z_P$$

$$i_{g0(\lambda/4)}=jv_{P-set}/Z_0$$

$$Z_{g0(\lambda/4)}=V_{g0(\lambda/4)}/i_{g0(\lambda/4)}=Z_0^2/Z_P \qquad (4)$$

[Allowable Voltage Ratio k and $Z_{amp}$ During the Regenerative Operation]

In the formula 4, the subscript at the time of impedance matching where $Z_L=Z_0$ is represented as "$z_0$", the subscript during the regenerative operation is represented as "$regen$", and when the allowable voltage ratio k of the load voltage $V_L$ is defined, assuming that the regenerative operation starts when the load voltage $V_L$ becomes k times larger than the load voltage $V_{L-Z0}$ at the time of impedance matching, the impedance $Z_{amp(\lambda/4)-regen}$ viewed from the high-frequency amplifier circuit at the time of regeneration, and the impedance $Z_{P(\lambda/4)-regen}$ at the connecting position P of the regeneration circulator are expressed respectively as the following:

$$Z_{amp(\lambda/4)-regen} = \{Z_0 - (k-1)R_{in}\}/k$$

$$Z_{P(\lambda/4)-regen} = kZ_0^2/\{Z_0 - (k-1)R_{in}\} \quad (5)$$

When the electrical length between the connecting position P of the regeneration circulator and the load end has an integral multiple relation in terms of the wavelength $\lambda$, this leads to a relation of $V_L = V_P$. Therefore, the allowable voltage ratio k can be set by the voltage $V_P$ at the connecting position P, instead of the load voltage $V_L$, and the allowable voltage ratio k may be configured in such a manner that the regenerative operation starts when the regenerative-operation starting voltage $V_{P-regen}$ becomes k times larger than the voltage $V_{P-Z0}$ at the time of impedance matching. FIG. 14 shows a relation between the regenerative-operation starting voltage $V_{P-regen}$ and the voltage $V_{P-Z0}$, where the allowable voltage ratio k is 2.

Under the following condition for maximizing the load voltage $v_L$, as a calculation example, $$Z_L = \infty$$

$$R_{in} = 8\Omega$$

$$Z_0 = 50\Omega, \text{ and}$$

Electrical length of the transmission line $l = \lambda/4$; there will now be described an example for reducing the load voltage $V_L$, where k=2 with the use of the regeneration circulator.

In the state where the impedance $Z_P$ on the load side relative to the connecting position P of the regeneration circulator is open ($Z_P = \infty$) on the load side, the impedance $Z_P$ becomes $Z_P = Z_R$ according to image impedance, when the parallel impedance $Z_R$ is connected by the regeneration circulator.

Here, $Z_{amp}$ and $Z_P$ are obtained by using the formula 5 as the following:

$$Z_{amp} = \{Z_0 - (k-1)R_{in}\}/k = \{50 - (2-1) \times 8\}/2 = 21[\Omega]$$

$$Z_P = Z_R = kZ_0^2/\{Z_0 - (k-1)R_{in}\} = 2 \times 50^2/\{50 - (2-1) \times 8\} \approx 119[\Omega]$$

This indicates that $Z_R$ (approximately 119Ω) is connected in parallel with the infinite load impedance at the point P, then preventing $Z_{amp}$ from becoming low impedance (short-circuited).

In the formula 5, even when the load is in the open state ($Z_L = \infty$), the allowable voltage ratio k is set to 1, thereby establishing $Z_{amp} = Z_P = 50\Omega$ and leading to the state of impedance matching.

The allowable voltage ratio k=1 indicates that the load voltage $V_L$ for starting the regenerative operation is set to be the load voltage $V_L-Z_0$ of impedance matching, and by performing the regenerative operation even during the normal state, it is possible to maintain the load voltage $V_L$ to be the load voltage $V_L-Z_0$ of impedance matching, against abnormality caused by an impedance mismatching.

[Relation Between $V_{L-regen}$ During Regenerative Operation and DC Power Source Voltage $V_{DD}$]

When the load voltage $V_L$ becomes k times larger than the effective value voltage $V_L-Z_0$ of impedance matching, the regenerative operation is started to perform regeneration of DC power into the DC power source voltage $V_{DD}$. Simultaneously, the upper-limit of the load voltage $V_L$ is restricted to the load voltage $V_{L-regen}$ for the regenerative operation.

In the case where the regeneration is performed by using the transformer, the DC power source voltage $V_{DD}$ being a regenerating destination may be defined by an average value $(2\sqrt{2}v_{P-regen}/\pi)$ of $V_{P-regen}(V_{L-regen})$, and the turn ratio N of the transformer.

When $Z_L$ is equal to $Z_0$, if the DC power source voltage $V_{DD}$ applied to the inverter of the high-frequency amplifier circuit and the regenerative-operation starting voltage $V_{P-z0}$ ($V_{L-z0}$) are already known, the turn ratio N of the transformer may be expressed by the following formula 6, using the allowable voltage ratio k:

$$N \times V_{DD} = 2\sqrt{2} \times V_{L-regen}/\pi = (2\sqrt{2} \times k \times v_{L-z0})/\pi$$

$$N = (2\sqrt{2} \times k \times V_{L-Z0})/(\pi \times V_{DD}) \approx (0.9 \times k \times v_{L-z0})/((\pi \times V_{DD}) \quad (6)$$

The descriptions of the above embodiments and modifications are intended to illustrate the DC generator and the method of controlling the DC generator as an example relating to the present invention, and the present invention is not limited to those embodiments. More specifically, it is intended that the invention embrace all modifications and variations of the exemplary embodiments described herein that fall within the spirit and scope of the invention.

INDUSTRIAL APPLICABILITY

The regeneration circulator, the high-frequency power supply device, and the regeneration method according to the present invention are applicable to a power supply unit and a power supply method for supplying high-frequency power to a load device being a plasma load, such as liquid-crystal panel manufacturing equipment, semiconductor producing equipment, and laser oscillator.

DESCRIPTION OF SYMBOLS

A to E electrical length
$I_{dc}$ output current
$I_{g0}$ current
$I_{inv}$ input voltage
N turn ratio
P connecting position
$R_L$ active component
$R_{in}$ internal resistance
$R_{on}$ resistance value
$V_{DD}$ DC power source voltage
$V_L$ load voltage
$V_P$ regenerative-operation starting voltage
$V_{g0}$ output end voltage
$V_{in}$ AC voltage source
$V_{pp}$ electrode voltage
$Z_0$ characteristic impedance
$Z_L$ load impedance
$Z_P$ impedance
$Z_R$ parallel impedance
$Z_{amp}$ output end impedance
$Z_{g0}$ output end impedance
$i_L$ effective value current
$i_{g0}$ effective value current
k allowable voltage ratio
$v_L$ load voltage
Γ voltage reflection coefficient
λ wavelength
1 high-frequency power supply device
2 high-frequency load 3 transmission path
4 transmission path
10 high-frequency power source
11 DC power source
12 high-frequency amplifier circuit
12a bridge circuit
12b transformer
13 output circuit
13a LC circuit
13b LPF
20 regeneration circulator
20a transformer
20b rectifier
20c capacitor
20d, 20e inductance
20f voltage divider
21 directional coupler
22 rectifier circuit
101 generator
102 load
104 transmission path
111 DC power source
112 high-frequency amplifier circuit
112a bridge circuit
112b transformer
113 output circuit
113a matching circuit
113b filter circuit

What is claimed is:

1. A regenerative circulator for regenerating RF power from a transmission path between a high-frequency amplifier circuit of a high-frequency power source and a high-frequency load, the regeneration circulator comprising:
a directional coupler configured to incorporate the high-frequency power in one direction from the transmission path, wherein,
an input end of the regeneration circulator is connected at a connecting position on the transmission path,
the regeneration circulator configures a parallel impedance for the transmission path in the state where the voltage at the input end of the regenerative circulator is higher relative to the set voltage, on the basis of a comparison between voltage at the input end of the regeneration circulator and set voltage,
the parallel impedance incorporates the high-frequency power in one direction from the connecting position and regenerates the high-frequency power,
the directional coupler incorporates the high-frequency power from the transmission path, on the basis of the comparison between the voltage at the input end of the regeneration circulator and the set voltage, and while regeneration is performed, the directional coupler configures an upper limit of the voltage at the input end of the regeneration circulator as the set voltage.

2. The regeneration circulator according to claim 1, wherein,
the connecting position on the transmission path where the input end of the regeneration circulator is connected, corresponds to a position indicating an antinode of a standing wave that is generated due to an impedance mismatching on the transmission path.

3. The regeneration circulator according to claim 1, wherein,
the connecting position on the transmission path where the input end of the regeneration circulator is connected, corresponds to a position on the transmission path, indicating an odd multiple of an electrical length being one-fourth wavelength ($\lambda/4$) of high-frequency wavelength ($\lambda$) that is outputted by the high-frequency power source, the length starting from the output end of the high-frequency amplifier circuit.

4. The regeneration circulator according to claim 1, wherein,
the directional coupler comprises a transformer, and
a turn ratio of the transformer is a value that is based on a voltage ratio of the set voltage and the voltage at the output end of the regeneration circulator.

5. The regeneration circulator according to claim 4, comprising a rectifier configured to convert AC output from the transformer into DC.

6. The regeneration circulator according to claim 4, wherein,
a capacitor is provided in parallel with the secondary side of the transformer.

7. The regeneration circulator according to claim 5, wherein,
a DC reactor is provided in series with a subsequent stage of the rectifier.

8. A high-frequency power supply device, comprising,
a high-frequency power source configured to feed high-frequency power into a high-frequency load,
a regeneration circulator configured to incorporate high-frequency power in one direction from a transmission path between a high-frequency amplifier circuit provided in the high-frequency power supply device and the high-frequency load, and to regenerate high-frequency power, and
a directional coupler configured to incorporate the high-frequency power in one direction from the transmission path, wherein,
an input end of the regeneration circulator is connected to a connecting position on the transmission path,
the regeneration circulator configures a parallel impedance for the transmission path in the state where the voltage at the input end of the regenerative circulator is higher relative to the set voltage, on the basis of a comparison between voltage at the input end of the regeneration circulator and set voltage,
the parallel impedance incorporates the high-frequency power from the connecting position and regenerates the high-frequency power,
the directional coupler incorporates the high-frequency power from the transmission path, on the basis of the comparison between the voltage at the input end of the regeneration circulator and the set voltage, and while regeneration is performed, the directional coupler configures an upper limit of the voltage at the input end of the regeneration circulator as the set voltage.

9. The high-frequency power supply device according to claim 8, wherein,
the connecting position on the transmission path where the input end of the regeneration circulator is connected, corresponds to a position indicating an antinode of a standing wave that is generated due to an impedance mismatching on the transmission path.

10. The high-frequency power supply device according to claim 8, wherein,
the connecting position on the transmission path where the input end of the regeneration circulator is connected, corresponds to a position on the transmission path, indicating an odd multiple of an electrical length being one-fourth wavelength ($\lambda/4$) of high-frequency wavelength ($\lambda$) that is outputted by the high-frequency power source, the length starting from the output end of the high-frequency amplifier circuit.

11. The high-frequency power supply device according to claim 8, wherein,
   the directional coupler comprises a transformer, and
   a turn ratio of the transformer is a value that is based on a voltage ratio of the set voltage and the voltage at the output end of the regeneration circulator.

12. The high-frequency power supply device according to claim 11, comprising a rectifier configured to convert AC output from the transformer into DC.

13. The high-frequency power supply device according to claim 12, wherein,
   a DC reactor is provided in series with a subsequent stage of the rectifier.

14. The high-frequency power supply device according to claim 11, wherein,
   a capacitor is provided in parallel with the secondary side of the transformer.

15. A method of regenerating high-frequency power by a regeneration circulator, from a transmission path between a high-frequency amplifier circuit of a high-frequency power source and a high-frequency load, comprising,
   connecting an input end of the regeneration circulator to a position on the transmission path,
   configuring a parallel impedance for the transmission path in the state where the voltage at the input end of the regenerative circulator is higher relative to the set voltage, on the basis of a comparison between voltage at the input end of the regeneration circulator and set voltage, and incorporating the high-frequency power in one direction from the transmission path and regenerating the high-frequency power, wherein,
   the parallel impedance incorporates the high-frequency power from the transmission path on the basis of the comparison between the voltage at the input end of the regeneration circulator and the set voltage, and while regeneration is performed, an upper limit of the voltage at the input end of the regeneration circulator is configured as the set voltage.

16. The method of regenerating high-frequency power according claim 15, wherein,
   the input end of the regeneration circulator is connected to a position on the transmission path, indicating an antinode of a standing wave that is generated due to an impedance mismatching on the transmission path.

17. The method of regenerating high-frequency power according to claim 15, wherein,
   the input end of the regeneration circulator is connected to a position on the transmission path, indicating an odd multiple of the electrical length being one-fourth wavelength ($\lambda/4$) of high-frequency wavelength ($\lambda$) that is outputted by the high-frequency power source on the transmission path, the length starting from the output end of the high-frequency amplifier circuit.

18. The method of regenerating high-frequency power according to claim 15, wherein,
   AC output of the high-frequency power is converted into DC, and then the high-frequency power is regenerated.

* * * * *